United States Patent
Lin

(10) Patent No.: US 9,891,991 B2
(45) Date of Patent: Feb. 13, 2018

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventor: Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 44 days.

(21) Appl. No.: 15/096,284

(22) Filed: Apr. 12, 2016

(65) Prior Publication Data

US 2017/0242748 A1 Aug. 24, 2017

(30) Foreign Application Priority Data

Feb. 23, 2016 (TW) ................................ 105105204

(51) Int. Cl.
| | |
|---|---|
| *H03M 13/00* | (2006.01) |
| *G06F 11/10* | (2006.01) |
| *G11C 29/52* | (2006.01) |
| *H03M 13/11* | (2006.01) |
| *H03M 13/45* | (2006.01) |

(52) U.S. Cl.
CPC .......... *G06F 11/1068* (2013.01); *G11C 29/52* (2013.01); *H03M 13/1102* (2013.01); *H03M 13/458* (2013.01)

(58) Field of Classification Search
CPC .. H03M 13/458; H03M 13/451; H03M 13/45; H03M 13/152; H03M 13/453; H03M 13/29; G11C 29/04; G11C 11/5642; G11C 29/021; G11C 29/028; G11C 16/26; G11C 7/14; G11C 2029/0411; G06F 11/1048; G06F 11/1008; G06F 11/1068; H04L 1/0045; H04L 1/0057

See application file for complete search history.

(56) References Cited

U.S. PATENT DOCUMENTS

| | | | |
|---|---|---|---|
| 8,255,758 B2 * | 8/2012 | Anholt | ................ G06F 11/1008 |
| | | | 714/752 |
| 2002/0161560 A1 * | 10/2002 | Abe | ........................ H04L 1/005 |
| | | | 702/196 |

(Continued)

*Primary Examiner* — Guerrier Merant
(74) *Attorney, Agent, or Firm* — JCIPRNET

(57) ABSTRACT

A decoding method, a memory storage device and a memory control circuit unit are provided. The decoding method includes: programming a first memory cell in a rewritable non-volatile memory module; reading the first memory cell based on a first hard-decision voltage level to obtain first hard-bit information and perform a hard-decoding process accordingly; if the hard-decoding process fails and the first memory cell belongs to a first type memory cell, reading the first memory cell based on a second hard-decision voltage level to obtain second hard-bit information and perform another hard-decoding process accordingly; if the hard-decoding process fails and the first memory cell belongs to a second type memory cell, reading the first memory cell based on multiple second soft-decision voltage level to obtain soft-bit information and perform soft-decoding process accordingly. Therefore, a balance can be maintained between a decoding speed and a decoding success rate.

27 Claims, 10 Drawing Sheets

(56) References Cited

U.S. PATENT DOCUMENTS

| | | | |
|---|---|---|---|
| 2004/0225940 A1* | 11/2004 | Kerr | H03M 13/05 714/752 |
| 2006/0020874 A1* | 1/2006 | Desai | H03M 13/2963 714/780 |
| 2012/0005558 A1* | 1/2012 | Steiner | G06F 11/1072 714/773 |
| 2013/0238955 A1* | 9/2013 | D'Abreu | G06F 11/1048 714/763 |
| 2014/0143637 A1* | 5/2014 | Cohen | H03M 13/1108 714/773 |
| 2015/0149871 A1* | 5/2015 | Chen | G06F 11/1068 714/773 |

* cited by examiner

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 105105204, filed on Feb. 23, 2016. The entirety of the above-mentioned patent application is hereby incorporated by reference herein and made a part of this specification.

BACKGROUND

Technology Field

The disclosure relates to a decoding technique, and particularly relates to a decoding method, a memory storage device and a memory control circuit unit.

Description of Related Art

Digital cameras, cell phones, and MP3 players have undergone rapid growth in recent years, so that consumer demands for storage media have also rapidly increased. A rewritable non-volatile memory module (for example, a flash memory) is suitable for being built in the aforementioned various portable multimedia devices due to its characteristics such as data non-volatility, low power consumption, small volume, non-mechanical structure, etc.

Generally, in order to ensure correctness of data stored in the rewritable non-volatile memory module, before a certain batch of data is stored in the rewritable non-volatile memory module, the data is first encoded. The encoded data (including the original data and an error correction code) is stored in the rewritable non-volatile memory module. Thereafter, the encoded data can be read from the rewritable non-volatile memory module for decoding, so as to correct an error probably existed therein.

However, in a decoding process, if an operation complexity of an adopted decoding algorithm is relatively low, a decoding speed of the decoding process is relatively fast, though a decoding success rate is relatively low; and if the operation complexity of the adopted decoding algorithm is relatively high, the decoding speed of the decoding process is relatively slow, though the decoding success rate is relatively high. Therefore, how to maintain a stable decoding speed under the premise of improving the decoding success rate of the decoding process has become one of the important issues studied and researched by related technicians of the field.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art

SUMMARY

The disclosure is directed to a decoding method, a memory storage device and a memory control circuit unit, which are capable of achieving a balance between a decoding speed and a decoding success rate.

An exemplary embodiment of the disclosure provides a decoding method, which is adapted to a rewritable non-volatile memory module including a plurality of memory cells. The decoding method includes following steps. At least one first memory cell among the memory cells is programmed. The first memory cell is read based on a first hard-decision voltage level, so as to obtain first hard-bit information. A hard-decoding process is performed according to the first hard-bit information, and it is determined whether the hard-decoding process fails. If the hard-decoding process fails, it is determined whether the first memory cell belongs to a first type memory cell or a second type memory cell. If the first memory cell belongs to the first type memory cell, the first memory cell is read based on a second hard-decision voltage level, so as to obtain second hard-bit information and perform the hard-decoding process according to the second hard-bit information, where the second hard-decision voltage level is different to the first hard-decision voltage level, where a total number of a first hard bit included in the first hard-bit information is equal to a total number of a second hard bit included in the second hard-bit information. If the first memory cell belongs to the second type memory cell, the first memory cell is read based on a plurality of soft-decision voltage levels, so as to obtain soft-bit information and perform a soft-decoding process according to the soft-bit information, where the total number of the second hard bit included in the second hard-bit information is smaller than a total number of a soft bit included in the soft-bit information.

Another exemplary embodiment of the disclosure provides a memory storage device, which includes a connection interface unit, a rewritable non-volatile memory module and a memory control circuit unit. The connection interface unit is coupled to a host system. The rewritable non-volatile memory module includes a plurality of memory cells. The memory control circuit unit is coupled to the connection interface unit and the rewritable non-volatile memory module. The memory control circuit unit is configured to send a writing command sequence indicating to program at least one first memory cell among the memory cells. The memory control circuit unit is further configured to send a first hard-reading command sequence indicating to read the first memory cell based on a first hard-decision voltage level, so as to obtain first hard-bit information. The memory control circuit unit is further configured to execute a hard-decoding process according to the first hard-bit information and determine whether the hard-decoding process fails. If the hard-decoding process fails, the memory control circuit unit is further configured to determine whether the first memory cell belongs to a first type memory cell or a second type memory cell. If the first memory cell belongs to the first type memory cell, the memory control circuit unit is further configured to send a second hard-reading command sequence indicating to read the first memory cell based on a second hard-decision voltage level, so as to obtain second hard-bit information. The memory control circuit unit is further configured to perform the hard-decoding process according to the second hard-bit information, where the second hard-decision voltage level is different to the first hard-decision voltage level, and a total number of a first hard bit included in the first hard-bit information is equal to a total number of a second hard bit included in the second hard-bit information. If the first memory cell belongs to the second type memory cell, the memory control circuit unit is further configured to send a soft-reading command sequence indicating to read the first memory cell based on a plurality of soft-decision voltage levels, so as to obtain soft-bit information, and the memory control circuit unit is further configured to execute a soft-decoding process according to the soft-bit information, where the total number of the second hard bit included in the second hard-bit information is smaller than a total number of a soft bit included in the soft-bit information.

Another exemplary embodiment of the disclosure provides a memory control circuit unit, which is adapted to control a rewritable non-volatile memory module including a plurality of memory cells. The memory control circuit unit includes a host interface, a memory interface, an error checking and correcting circuit and a memory management circuit. The host interface is coupled to a host system. The memory interface is coupled to the rewritable non-volatile memory module. The memory management circuit is coupled to the host interface, the memory interface and the error checking and correcting circuit. The memory management circuit is configured to send a writing command sequence indicating to program at least one first memory cell among the memory cells. The memory management circuit is further configured to send a first hard-reading command sequence indicating to read the first memory cell based on a first hard-decision voltage level, so as to obtain first hard-bit information. The error checking and correcting circuit is configured to execute a hard-decoding process according to the first hard-bit information, and the memory management circuit is further configured to determine whether the hard-decoding process fails. If the hard-decoding process fails, the memory management circuit is further configured to determine whether the first memory cell belongs to a first type memory cell or a second type memory cell. If the first memory cell belongs to the first type memory cell, the memory management circuit is further configured to send a second hard-reading command sequence indicating to read the first memory cell based on a second hard-decision voltage level, so as to obtain second hard-bit information. The error checking and correcting circuit is further configured to perform the hard-decoding process according to the second hard-bit information, where the second hard-decision voltage level is different to the first hard-decision voltage level, and a total number of a first hard bit included in the first hard-bit information is equal to a total number of a second hard bit included in the second hard-bit information. If the first memory cell belongs to the second type memory cell, the memory management circuit is further configured to send a soft-reading command sequence indicating to read the first memory cell based on a plurality of soft-decision voltage levels, so as to obtain soft-bit information, and the error checking and correcting circuit is further configured to execute a soft-decoding process according to the soft-bit information, where the total number of the second hard bit included in the second hard-bit information is smaller than a total number of a soft bit included in the soft-bit information.

According to the above description, after a hard-decoding process corresponding to a certain memory cell is failed, one of the hard-decoding process and a soft-decoding process is subsequently executed with reference to the type of the memory cell. In this way, compared to a general standard decoding process, the selection of hard-decoding and soft-decoding of the disclosure is more flexible, so as to achieve a balance between a decoding speed and a decoding success rate.

In order to make the aforementioned and other features and advantages of the disclosure comprehensible, several exemplary embodiments accompanied with figures are described in detail below.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
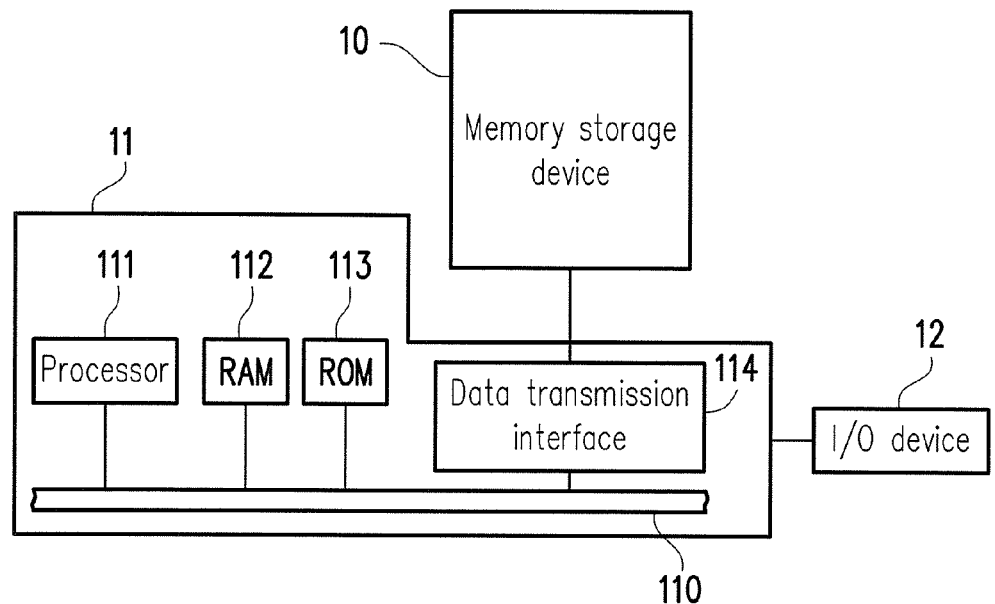
FIG. 1 is a schematic diagram of a host system, a memory storage device and an input/output (I/O) device according to an exemplary embodiment of the present disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (which is also referred to as a memory storage system) includes a rewritable non-volatile memory module and a controller (which is also referred to as a control circuit). The memory storage device is generally used together with a host system, and the host system can write data into the memory storage device and read data from the memory storage device.

Figure 2:
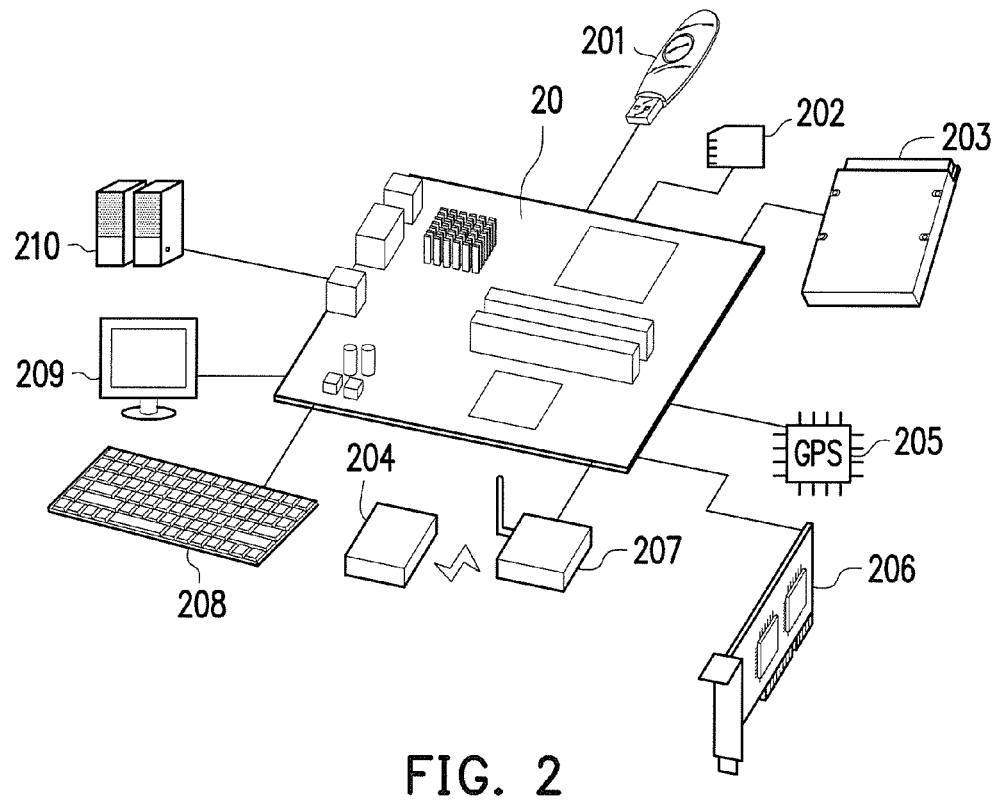
FIG. 2 is a schematic diagram of a host system, a memory storage device and an I/O device according to another exemplary embodiment of the present disclosure.

FIG. 1 is a schematic diagram of a host system, a memory storage device and an input/output (I/O) device according to an exemplary embodiment of the present disclosure. FIG. 2 is a schematic diagram of a host system, a memory storage device and an I/O device according to another exemplary embodiment of the present disclosure.

Referring to FIG. 1 and FIG. 2, the host system 11 generally includes a processor 111, a random access memory (RAM) 112, a read only memory (ROM) 113 and a data transmission interface 114. The processor 111, the RAM 112, the ROM 113 and the data transmission interface 114 are all coupled to a system bus 110.

In the present exemplary embodiment, the host system 11 is coupled to the memory storage device 10 through the data transmission interface 114. For example, the host system 11 may store data into the memory storage device 10 or read data from the memory storage device 10 through the data transmission interface 114. Moreover, the host system 11 is coupled to the I/O device 12 through the system bus 110. For example, the host system 11 may transmit an output signal to the I/O device 12 or receive an input signal from the I/O device 12 through the system bus 110.

In the present exemplary embodiment, the processor 111, the RAM 112, the ROM 113 and the data transmission interface 114 can be disposed on a motherboard 20 of the host system 11. The number of the data transmission interface 114 can be one or plural. The motherboard 20 can be coupled to the memory storage device 10 in a wired or wireless manner through the data transmission interface 114. The memory storage device 10 is, for example, a flash drive 201, a memory card 202, a solid state driver (SSD) 203 or a wireless memory storage device 204. The wireless memory storage device 204 is, for example, a memory storage device based on a wireless communication technique, such as a near field communication (NFC) memory storage device, a wireless fidelity (WiFi) memory storage device, a bluetooth memory storage device or a low power bluetooth memory storage device (for example, Beacon), etc. Moreover, the motherboard 20 can also be coupled to various I/O devices such as a global positioning system (GPS) module 205, a network interface card 206, a wireless transmission device 207, a keyboard 208, a screen 209, a loudspeaker 210, etc., through the system bus 110. For example, in an exemplary embodiment, the motherboard 20 may access the wireless memory storage device 204 through the wireless transmission device 207.

Figure 3:
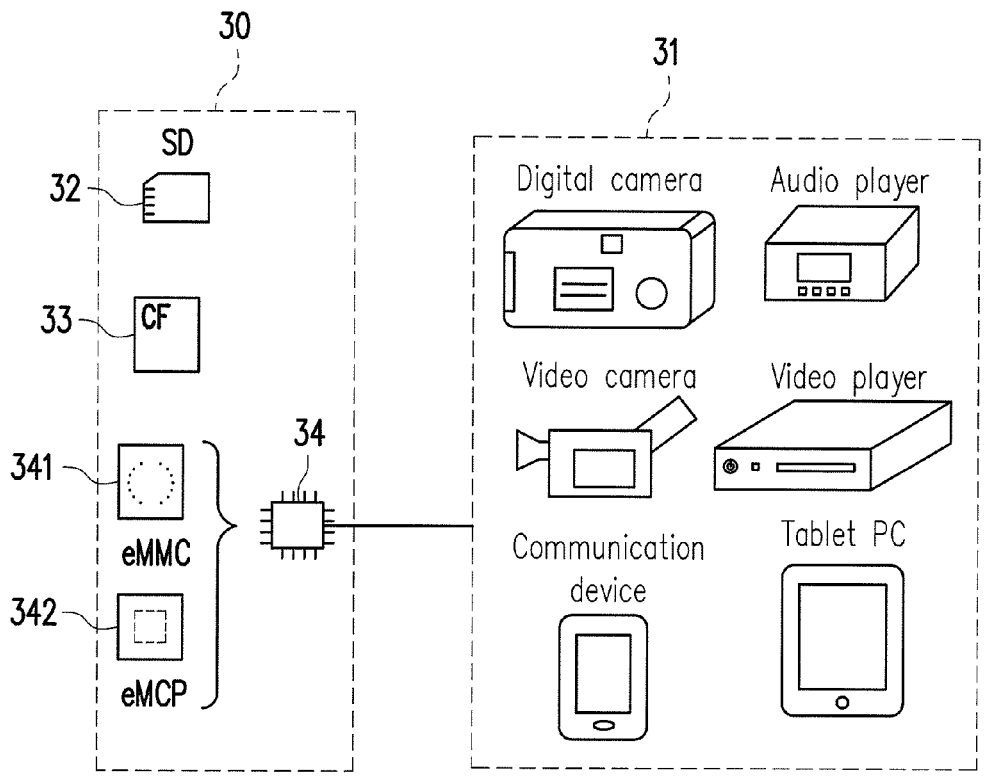
FIG. 3 is a schematic diagram of a host system and a memory storage device according to another exemplary embodiment of the present disclosure.

In an exemplary embodiment, the aforementioned host system can be any system substantially cooperated with the memory storage device to store data. In the aforementioned exemplary embodiment, the host system implemented by a computer system is taken as an example for description; however, FIG. 3 is a schematic diagram of a host system and a memory storage device according to another exemplary embodiment of the present disclosure. Referring to FIG. 3, in another exemplary embodiment, the host system 31 can also be a digital camera, a video camera, a communication device, an audio player, a video player or a tablet PC, etc., and the memory storage device 30 can be a non-volatile memory storage device such as a secure digital (SD) card 32, a compact flash (CF) card 33, or an embedded storage device 34, etc., used by the host system 31. The embedded storage device 34 includes an embedded multimedia card (eMMC) 341 and/or an embedded multi chip package (eMCP) storage device 342, etc., that is formed by directly coupling various memory modules to a substrate of the host system.

Figure 4:
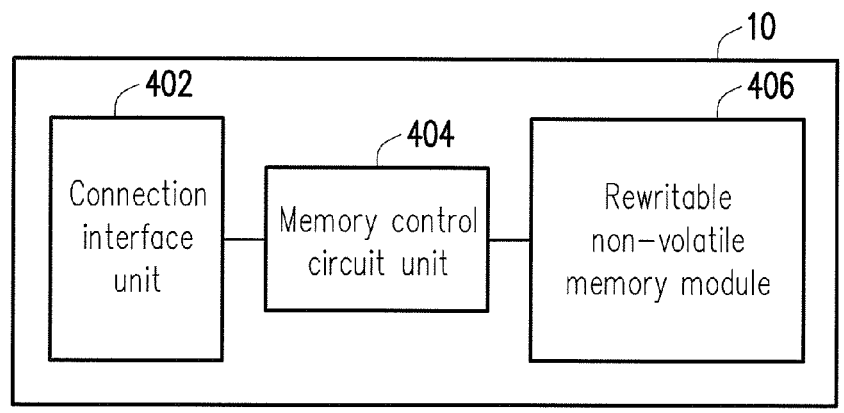
FIG. 4 is a schematic block diagram of a memory storage device according to an exemplary embodiment of the present disclosure.

FIG. 4 is a schematic block diagram of a memory storage device according to an exemplary embodiment of the present disclosure.

Referring to FIG. 4, the memory storage device 10 includes a connection interface unit 402, a memory control circuit unit 404 and a rewritable non-volatile memory module 406.

In the present exemplary embodiment, the connection interface unit 402 is complied with a serial advanced technology attachment (SATA) standard. However, it should be noted that the present disclosure is not limited thereto, and the connection interface unit 402 can also be complied with a parallel advanced technology attachment (PATA) standard, an institute of electrical and electronic engineers (IEEE) 1394 standard, a peripheral component interconnect (PCI) express standard, a universal serial bus (USB) standard, an SD interface standard, an ultra high speed-I (UHS-I) interface standard, an ultra high speed-II (UHS-II) interface standard, a memory stick (MS) interface standard, a multi-chip package interface standard, a multimedia card (MMC) interface standard, an eMMC interface standard, a universal flash storage (UFS) interface standard, an eMCP interface standard, a CF interface standard, an integrated device electronics (IDE) standard or other suitable standards. The connection interface unit 402 and the memory control circuit unit 404 can be packaged in one chip, or the connection interface unit 402 may be disposed outside a chip containing the memory control circuit unit 404.

The memory control circuit unit 404 may execute a plurality of logic gates or control instructions implemented in a hardware form or a firmware form, and may perform a writing operation, a reading operation or an erasing operation on the rewritable non-volatile memory module 406 according to commands of the host system 11.

The rewritable non-volatile memory module 406 is coupled to the memory control circuit unit 404 for storing data written by the host system 11. The rewritable non-volatile memory module 406 can be a single level cell (SLC) NAND flash memory module (i.e. a flash memory module with one memory cell storing data of one bit), a multi level cell (MLC) NAND flash memory module (i.e. a flash memory module with one memory cell storing data of two bits), a triple level cell (TLC) NAND flash memory module (i.e. a flash memory module with one memory cell storing data of three bits), other flash memory modules or other memory modules having the same characteristic.

Each memory cell of the rewritable non-volatile memory module 406 stores one or a plurality of bits through variation of a voltage (which is referred to as a threshold voltage hereinafter). To be specific, a control gate and a channel of each memory cell have a charge trapping layer therebetween. By applying a writing voltage to the control gate, an amount of electrons of the charge trapping layer can be changed, so as to change the threshold voltage of the memory cell. The procedure of changing the threshold voltage is referred to as "writing data into the memory cell" or "programming the memory cell". Along with the variation of the threshold voltage, each memory cell of the rewritable non-volatile memory module 406 has a plurality of storage states. By applying a reading voltage, the storage state of the memory cell can be determined, so as to obtain one or a plurality of bits stored in the memory cell.

Figure 5:
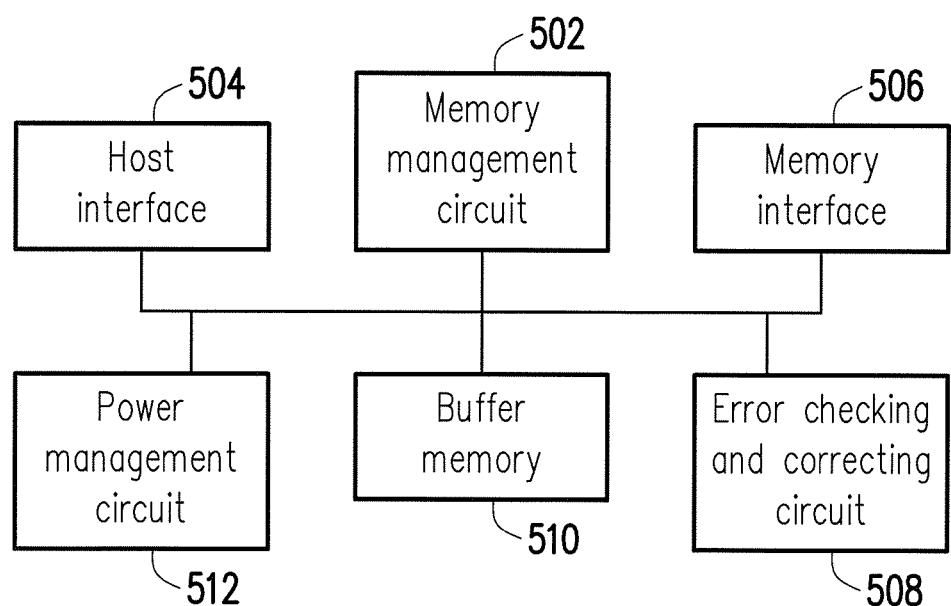
FIG. 5 is a schematic block diagram of a memory control circuit unit according to an exemplary embodiment of the present disclosure.

FIG. 5 is a schematic block diagram of a memory control circuit unit according to an exemplary embodiment of the present disclosure.

Referring to FIG. 5, the memory control circuit unit 404 includes a memory management circuit 502, a host interface 504, a memory interface 506 and an error checking and correcting circuit 508.

The memory management circuit 502 is configured to control a whole operation of the memory control circuit unit 404. To be specific, the memory management circuit 502 has a plurality of control instructions, and when the memory storage device 10 operates, these control instructions are executed to implement data writing, reading, erasing operations, etc. Following description of the operations of the memory management circuit 502 is equivalent to description of the operations of the memory control circuit unit 404.

In the present exemplary embodiment, the control instructions of the memory management circuit 502 are implemented in a firmware form. For example, the memory management circuit 502 has a micro processing unit (not shown) and a read-only memory (not shown), and these control instructions are burned in the read-only memory. When the memory storage apparatus 10 operates, these control instructions are executed by the micro processing unit to implement the data writing, reading, erasing operations, etc.

In another exemplary embodiment, the control instructions of the memory management circuit 502 may also be stored in a specific area (for example, a system area used for storing system data in the memory module) of the rewritable non-volatile memory module 406 as program codes. Moreover, the memory management circuit 502 has a micro processing unit (not shown), a read-only memory (not shown) and a random access memory (RAM) (not shown). Particularly, the read-only memory has a boot code, and when the memory control circuit unit 404 is enabled, the micro processing unit first runs the boot code to load the control instructions stored in the rewritable non-volatile memory module 406 to the RAM of the memory management circuit 502. Then, the micro processing unit executes these control instructions to implement the data writing, reading, erasing operations, etc.

Moreover, in another exemplary embodiment of the present disclosure, the control instructions of the memory management circuit 502 may also be implemented in a hardware form. For example, the memory management circuit 502 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro controller. The memory cell management circuit is used for managing memory cells of the rewritable non-volatile memory module 406 or groups thereof. The memory writing circuit is used for sending a writing command sequence to the rewritable non-volatile memory module 406 to write data into the rewritable non-volatile memory module 406. The memory reading circuit is used for sending a reading command sequence to the rewritable non-volatile memory module 406 to read data from the rewritable non-volatile memory module 406. The memory erasing circuit is used for sending an erasing command sequence to the rewritable non-volatile memory module 406 to erase data in the rewritable non-volatile memory module 406. The data processing circuit is used for processing data to be written into the rewritable non-volatile memory module 406 and data read from the rewritable non-volatile memory module 406. The writing command sequence, the reading command sequence and the erasing command sequence may respectively include one or a plurality of program codes or command codes, and are used for instructing the rewritable non-volatile memory module 406 to execute the corresponding writing, reading, erasing operations, etc. In an exemplary embodiment, the memory management circuit 502 may further send other types of command sequences to the rewritable non-volatile memory module 406 to execute corresponding operations.

The host interface 504 is coupled to the memory management circuit 502, and is configured to receive and recognize commands and data transmitted by the host system 11. Namely, the commands and data transmitted by the host system 11 are transmitted to the memory management circuit 502 through the host interface 504. In the present exemplary embodiment, the host interface 504 is complied with the SATA standard. However, the present disclosure is not limited thereto, and the host interface 504 can also be complied with the PATA standard, the IEEE 1394 standard, the PCI express standard, the USB standard, the SD standard, the UHS-I standard, the UHS-II standard, the MS standard, the MMC standard, the eMMC standard, the UFS standard, the CF standard, the IDE standard or other suitable data transmission standards.

The memory interface 506 is coupled to the memory management circuit 502 and is configured to access the rewritable non-volatile memory module 406. Namely, data to be written into the rewritable non-volatile memory module 406 is converted into a format that can be accepted by the rewritable non-volatile memory module 406 through the memory interface 506. To be specific, when the memory management circuit 502 accesses the rewritable non-volatile memory module 406, the memory interface 506 sends corresponding command sequences. For example, the command sequences may include a writing command sequence indicating to write data, a reading command sequence indicating to read data, an erasing command sequence indicating to erase data, and corresponding command sequences indicating various memory operations (for example, to change a reading voltage level or execute a garbage collection procedure, etc.). These command sequences are, for example, generated by the memory management circuit 502, and are transmitted to the rewritable non-volatile memory module 406 through the memory interface 506. These command sequences may include one or a plurality of signals, or data on the bus. The signals or data may include command codes or program codes. For example, the reading command sequence may include information of an identification code, a memory address, etc. for reading data.

The error checking and correcting circuit 508 is coupled to the memory management circuit 502 and is used for executing an error checking and correcting procedure to ensure correctness of data. To be specific, when the memory management circuit 502 receives a writing command from the host system 11, the error checking and correcting circuit 508 generates an error correcting code (ECC) and/or an error detecting code (EDC) for the data corresponding to the writing command, and the memory management circuit 502 writes the data corresponding to the writing command and the corresponding ECC and/or the EDC to the rewritable non-volatile memory module 406. Then, when the memory management circuit 502 reads data from the rewritable non-volatile memory module 406, the ECC and/or the EDC corresponding to the data are simultaneously read, and the error checking and correcting circuit 508 performs the error checking and correcting procedure on the read data according to the ECC and/or the EDC.

In the present exemplary embodiment, the error checking and correcting circuit 508 adopts a low density parity code (LDPC). However, in another exemplary embodiment, the error checking and correcting circuit 508 may also adopt a BCH code, a convolutional code, a turbo code, a bit flipping coding/decoding algorithm, etc.

In an exemplary embodiment, the memory control circuit unit 404 further includes a buffer memory 510 and a power management circuit 512.

The buffer memory 510 is coupled to the memory management circuit 502 and is used for temporarily storing data and commands coming from the host system 11, or data coming from the rewritable non-volatile memory module 406. The power management circuit 512 is coupled to the memory management circuit 502, and is used for controlling a power of the memory storage device 10.

In the present embodiment, the memory cells of the rewritable non-volatile memory module 406 construct a plurality of physical programming units, and the physical programming units construct a plurality of physical erasing unit. To be specific, the memory cells on a same word line consist one or a plurality of physical programming units. If one memory cell store two or more bits, the physical programming units on the same word line can be at least categorized into a lower physical programming unit and an upper physical programming unit. For example, a least significant bit (LSB) of one memory cell belongs to the lower physical programming unit, and a most significant bit (MSB) of one memory cell belongs to the upper physical programming unit. Generally, in an MLC NAND flash memory, a writing speed of the lower physical programming unit is greater than that of the upper physical programming unit, and/or reliability of the lower physical programming unit is higher than that of the upper physical programming unit.

In the present exemplary embodiment, physical programming unit is the smallest unit for programming data. Namely, physical programming unit is the smallest unit for writing data. For example, the physical programming unit is a physical page or a physical sector. If the physical programming unit is physical page, each physical programming unit generally includes a data bit area and a redundant bit area. The data bit area includes a plurality of physical sectors, and is configured for storing user data, and the redundant bit area is configured for storing system data (for example, error checking and correcting (ECC) codes).

In the present exemplary embodiment, each data bit area includes 32 physical sectors, and the size of one physical sector is 512 bytes (B). However, in other exemplary embodiments, the data bit area may also include 8, 16 or more or less physical sectors, and the size of each physical sector can be larger or smaller. On the other hand, physical erasing unit is the smallest unit for erasing data. Namely, each physical erasing unit contains the least number of memory cells that are erased all together. For example, the physical erasing unit is a physical block.

Figure 6:
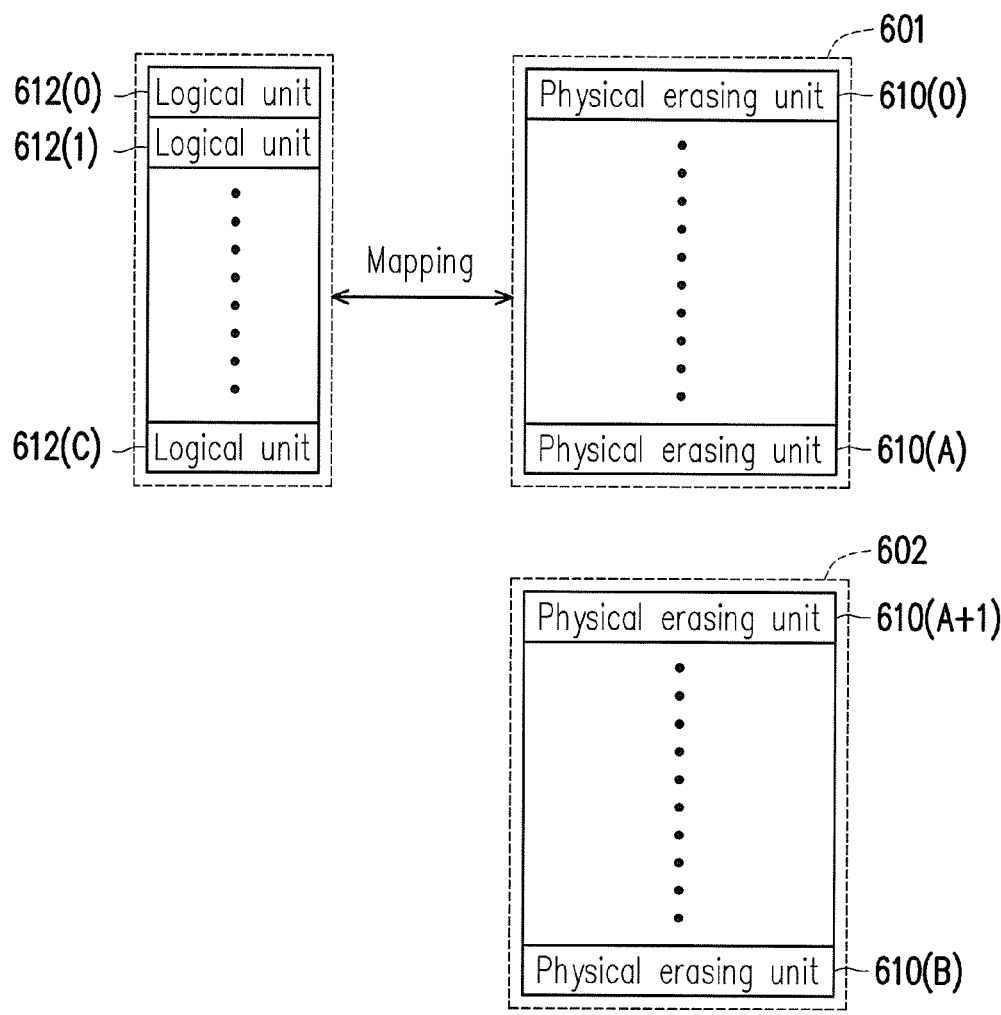
FIG. 6 is a schematic diagram of managing a rewritable non-volatile memory module according to an exemplary embodiment of the present disclosure.

FIG. 6 is a schematic diagram of managing the rewritable non-volatile memory module according to an exemplary embodiment of the present disclosure.

Referring to FIG. 6, the memory management circuit 502 may group physical erasing units 610(0)-610(B) of the rewritable non-volatile memory module 406 into a storage region 601 and a substitute region 602. The physical erasing units 610(0)-610(A) in the storage region 601 are used for storing data, and the physical erasing units 610(A+1)-610(B) in the substitute region 602 are used for substituting damaged physical erasing units in the storage region 601.

In the present exemplary embodiment, the memory management circuit 502 configures logical units 612(0)-612(C) for mapping at least a part of the physical erasing units 610(0)-610(A) in the storage region 601. In the present exemplary embodiment, the host system 11 accesses data stored in the storage region 601 through logical addresses (LA). Therefore, each of the logical units 612(0)-612(C) refers to one logical address. However, in another exemplary embodiment, each of the logical units 612(0)-612(C) may refer to one logical programming unit, one logical erasing unit or consist of a plurality of continuous or discontinuous logical addresses, which is determined according to an actual requirement. Moreover, each of the logical units 612(0)-612(C) can be mapped to one or a plurality of physical erasing units.

In the present exemplary embodiment, the memory management circuit 502 records a mapping relationship (which is also referred to as logical-physical mapping relationship) between the logical units and the physical erasing units to at least one logical-physical mapping table. When the host system 11 wants to read data from the memory storage device 10 or write data into the memory storage device 10, the memory management circuit 502 may execute data accessing of the memory storage device 10 according to the logical-physical mapping table.

Figure 7:
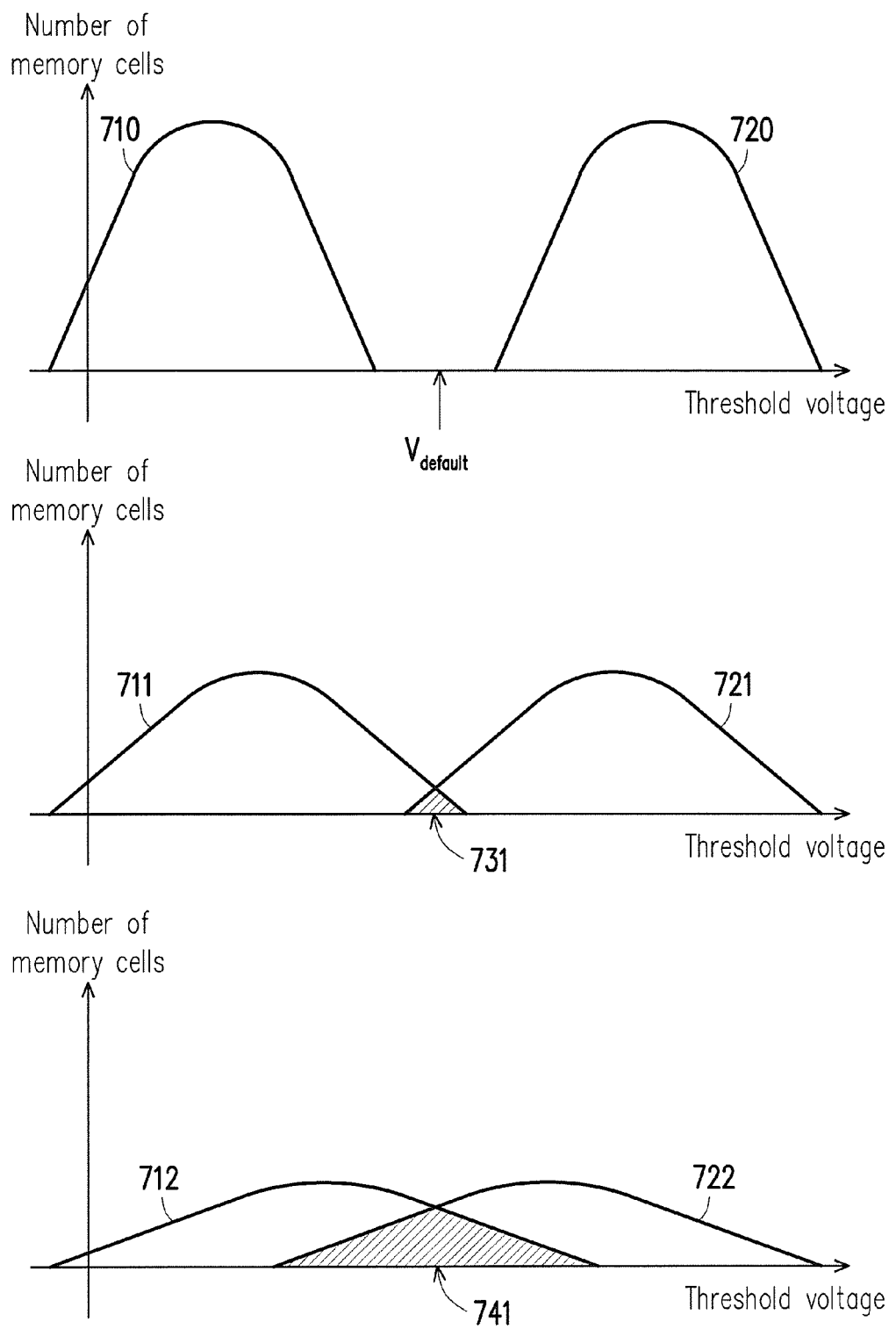
FIG. 7 is a schematic diagram of a threshold voltage distribution of a plurality of memory cells according to an exemplary embodiment of the disclosure.

FIG. 7 is a schematic diagram of a threshold voltage distribution of a plurality of memory cells according to an exemplary embodiment of the disclosure. In the present exemplary embodiment, the SLC NAND flash memory is taken as an example for description, in which a horizontal axis represents threshold voltage of memory cells, and a vertical axis represents the number of memory cells. However, in another exemplary embodiment, FIG. 7 may also represent a part of threshold voltage distribution of the MLC NAND or TLC NAND flash memory.

Referring to FIG. 7, after the memory cells in the rewritable non-volatile memory module 406 are programmed, a threshold voltage of each programmed memory cell belongs to one of distributions 710 and 720. For example, if a certain memory cell is used for storing a bit "1", the threshold voltage of such memory cell belongs to the distribution 710, and if a certain memory cell is used for storing a bit "0", the threshold voltage of such memory cell belongs to the distribution 720. In the present embodiment, the programmed memory cells belong to a physical programming unit. However, in another exemplary embodiment, the programmed memory cells may also belong to a physical erasing unit.

It should be noted that in the present exemplary embodiment, each memory cell is used for storing one bit, so that the distribution of the threshold voltages of the memory cells has two possibilities (for example, the distribution 710 and the distribution 720). However, in other exemplary embodiments, if one memory cell is used for storing a plurality of bits, the distribution of the threshold voltages of the memory cells may have four possibilities (for example, the MLC NAND flash memory), eight possibilities (for example, the TLC NAND flash memory) or other any number of possibilities. Moreover, the bit represented by each distribution is not limited by the disclosure. For example, in another exemplary embodiment of FIG. 7, the distribution 710 may represent the bit "0", and the distribution 720 may represent the bit "1".

In the present exemplary embodiment, when data stored in at least one memory cell (which is referred to as a first memory cell) of the memory cells is to be read, the memory management circuit 502 sends a predetermined reading command sequence (which is referred to as a hard-reading command sequence hereinafter) to the rewritable non-volatile memory module 406. The hard-reading command sequence indicates to read the first memory cell or a physical unit where the first memory cell belongs to based on a predetermined reading voltage level (which referred to as a hard-decision voltage level hereinafter). For example, the physical unit refers to a physical programming unit. According to the hard-reading command sequence, the rewritable non-volatile memory module 406 uses a hard-decision voltage level (for example, a reading voltage level $V_{default}$ in FIG. 7) to read the first memory cell and transmits the obtained bit information (which is referred to as hard-bit information hereinafter) to the memory management circuit 502, where the hard-bit information includes bit data (which is referred to as a hard bit hereinafter) read from each of the first memory cells. For example, if the threshold voltage of a certain first memory cell is smaller than the reading voltage level $V_{default}$ (for example, the memory cell with the threshold voltage belonging to the distribution 710), the memory management circuit 502 reads a hard bit "1"; and if the threshold voltage of a certain first memory cell is greater than the reading voltage level $V_{default}$ (for example, the memory cell with the threshold voltage belonging to the distribution 720), the memory management circuit 502 reads a hard bit "0".

Referring to FIG. 7 again, along with increase of a usage time and/or change of an operation environment of the rewritable non-volatile memory module 406, the memory cells of the rewritable non-volatile memory module 406 probably have performance degradation. For example, after the memory cells belonging to the distributions 710 and 720 have the performance degradation, the distributions 710 and 720 may gradually approach to each other or even overlap to each other. For example, distributions 711 and 721 respectively represent the distributions 710 and 720 with the performance degradation. The distributions 711 and 721 have an overlapped region 731 (indicated by slant lines) therebetween.

After the performance degradation is occurred, if the same hard-decision voltage level (for example, the reading voltage level $V_{default}$) is continually used to read the first memory cell, the read hard bit may include many errors. For example, the errors include misidentifying the memory cell belonging to the distribution 711 as belonging to the distribution 721, or misidentifying the memory cell belonging to the distribution 721 as belonging to the distribution 711. Therefore, in the present exemplary embodiment, the error checking and correcting circuit 508 may execute a predetermined decoding process (which is referred to as a hard-decoding process hereinafter) according to the obtained hard-bit information, so as to try to correct the errors probably existed in the obtained hard bit. If the executed hard-decoding process fails, more hard-decoding processes can be repeatedly executed.

Figure 8:
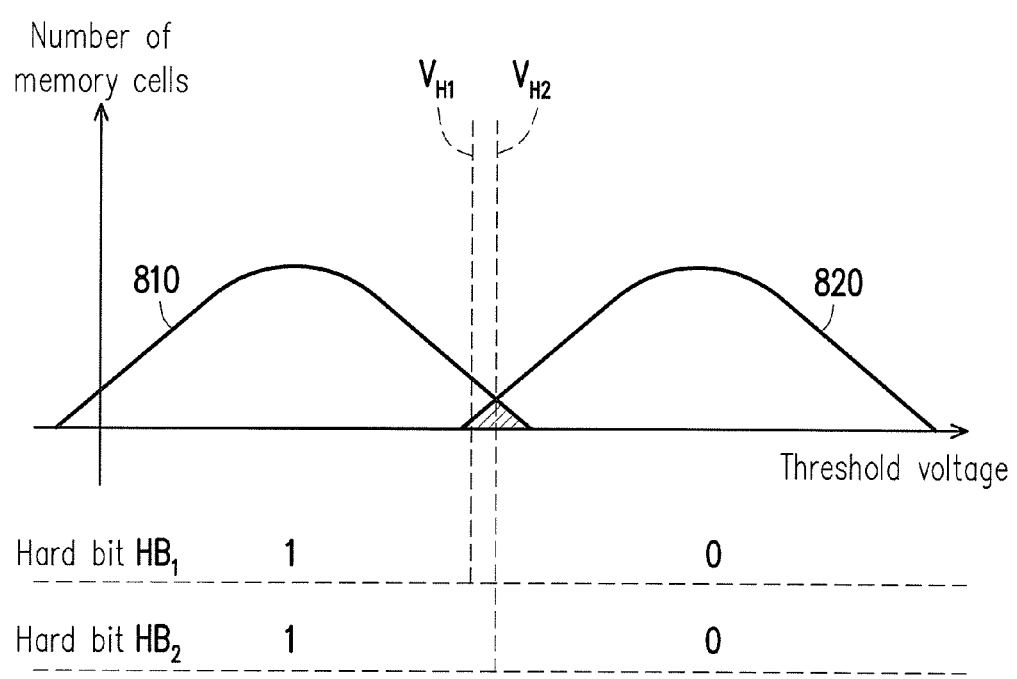
FIG. 8 is a schematic diagram of a hard-decoding process according to an exemplary embodiment of the disclosure.

FIG. 8 is a schematic diagram of a hard-decoding process according to an exemplary embodiment of the disclosure.

Referring to FIG. 8, it is assumed that the threshold voltages of each of the first memory cells consist distributions 810 and 820. When the data in the first memory cell is to be read, the memory management circuit 502 sends a hard-reading command sequence (which is referred to as a first hard-reading command sequence hereinafter) to the rewritable non-volatile memory module 406. The first hard-reading command sequence indicates to read the first memory cell or the physical unit where the first memory cell belongs to based on a hard-decision voltage level (which is refereed to as a first hard-decision voltage level hereinafter). According to the first hard-reading command sequence, the rewritable non-volatile memory module 406 uses the first hard-decision voltage level to read the first memory cell and transmits the obtained bit information (which is referred to as first hard-bit information hereinafter) to the memory management circuit 502.

In the present exemplary embodiment, the first hard-decision voltage level is, for example, a reading voltage level $V_{H1}$ of FIG. 8. The obtained first hard-bit information may include a hard bit (which is referred to as a first hard bit) $HB_1$ read from each of the first memory cells. For example, if the threshold voltage of a certain first memory cell is smaller than the reading voltage level $V_{H1}$, the memory management circuit 502 reads the hard bit $HB_1$ with a bit value of "1"; and if the threshold voltage of a certain first memory cell is greater than the reading voltage level $V_{H1}$, the memory management circuit 502 reads the hard bit $HB_1$ with a bit value of "0".

The error checking and correcting circuit 508 may execute a hard-decoding process (which is referred to as a first hard-decoding process hereinafter) according to the obtained first hard-bit information. In the first hard-decoding process, the error checking and correcting circuit 508 tries to correct the errors probably existed in the obtained first hard bits. If the errors in the first hard bits are all corrected, it represents that the decoding is successful, and the error checking and correcting circuit 508 outputs the successfully decoded bits and ends the first hard-decoding process (or end the whole decoding process).

If the errors in the first hard bits are not all corrected, it represents that the decoding process is failed, and the memory management circuit 502 adjusts the hard-decision voltage level (for example, to adjust the hard-decision voltage level from the first hard decision voltage level to another hard-decision voltage level) and sends another hard-reading command sequence (which is referred to as a second hard-reading command sequence) to the rewritable non-volatile memory module 406. The second hard-reading command sequence indicates to read the first memory cell or the physical unit where the first memory cell belongs to based on the adjusted hard-decision voltage level (which is referred to as a second hard-decision voltage level hereinafter). According to the second hard-reading command sequence, the rewritable non-volatile memory module 406 uses the second hard-decision voltage level to read the first memory cell and transmits the obtained bit information (which is referred to as second hard-bit information hereinafter) to the memory management circuit 502.

In the present exemplary embodiment, the second hard-decision voltage level is, for example, a reading voltage level $V_{H2}$ of FIG. 8. The obtained second hard-bit information may include another hard bit (which is referred to as a second hard bit) $HB_2$ read from each of the first memory cells. For example, if the threshold voltage of a certain first memory cell is smaller than the reading voltage level $V_{H2}$, the memory management circuit 502 reads the hard bit $HB_2$ with the bit value of "1"; and if the threshold voltage of a certain first memory cell is greater than the reading voltage level $V_{H2}$, the memory management circuit 502 reads the hard bit $HB_2$ with the bit value of "0". In the present exemplary embodiment, a total number of the hard bits $HB_1$ in the first hard-bit information is equal to a total number of the hard bits $HB_2$ in the second hard-bit information.

The error checking and correcting circuit 508 may execute anther hard-decoding process (which is referred to as a second hard-decoding process hereinafter) according to the obtained second hard-bit information. In the second hard-decoding process, the error checking and correcting circuit 508 tries to correct the errors probably existed in the obtained second hard bits. If the errors in the second hard bits are all corrected, it represents that the decoding is successful, and the error checking and correcting circuit 508 outputs the successfully decoded bits and ends the second hard-decoding process (or end the whole decoding process). Moreover, if the errors in the second hard bits are not all corrected, it represents that the decoding process is failed, and the memory management circuit 502 again adjusts the hard-decision voltage level used for reading the first memory cell, and more hard-decoding processes can be continually executed.

In an exemplary embodiment, if a certain hard-decoding process is failed, the memory management circuit 502 may determine whether the number of execution times of the hard-decoding processes reaches a threshold value (which is referred to as a first threshold value hereinafter). If the number of execution times of the hard-decoding processes has reached the first threshold value, the memory management circuit 502 determines that the decoding is failed, and ends the hard-decoding process (or end the whole decoding process). If the number of execution times of the hard-decoding processes does not reach the first threshold value, the memory management circuit 502 may again adjust the hard-decision voltage level used for reading the first memory cell, and more hard-decoding processes can be continually executed.

Referring back to FIG. 7, regarding the memory cells with the threshold voltages belonging to the distributions 711 and 721, if these memory cells are continually used, the memory cells probably have continuous performance degradation. Therefore, the distributions 711 and 721 may be further changed into distributions 712 and 722. The distributions 712 and 722 include an overlapped region 741 (indicated by slant lines) therebetween. An area size of the overlapped region 741 is greater than an area size of the overlapped region 731. Alternatively, a total number of memory cells with the threshold voltages belonging to the overlapped region 741 is greater than a total number of memory cells with the threshold voltages belonging to the overlapped region 731.

Compared to the distributions 711 and 721, if a certain hard-decision voltage level (for example, one of the reading voltage levels $V_{default}$, $V_{H1}$, $V_{H2}$, etc.) is used to read the first memory cells in the distributions 712 and 722, the read hard bits probably include more errors. For example, compared to the distribution 711 and 721, more memory cells belonging to the distribution 712 are probably misjudged to belong to the distribution 722, and more memory cells belonging to the distribution 722 are probably misjudged to belong to the distribution 712. In this case, limited by the decoding capability (or error correcting capability) of the hard-decoding process, even if more hard-decision voltage levels are used to read the first memory cells and more times of the hard-decoding processes are correspondingly executed, it probably cannot correct all of the errors in the obtained hard bits according to the single hard-decoding information.

In the present exemplary embodiment, regarding the memory cells with the threshold voltages belonging to the distributions 712 and 722, if the first hard-decoding process executed according to the first hard-bit information fails, the memory management circuit 502 continually sends another predetermined reading command sequence (which is referred to as a soft-reading command sequence) to the rewritable non-volatile memory module 406. The soft-reading command sequence indicates to read the first memory cell or the physical unit where the first memory cell belongs to based on a plurality of predetermined reading voltage levels (which are referred to as soft-decision voltage levels hereinafter). According to the soft-reading command sequence, the rewritable non-volatile memory module 406 uses the soft-decision voltage levels to read the first memory cell and transmits the obtained bit information (which is referred to as soft-bit information hereinafter) to the memory management circuit 502. The obtained soft-bit information includes a plurality of bit data (which is referred to as soft bits) read from each of the first memory cells. The error checking and correcting circuit 508 executes another predetermined decoding process (which is referred to as a soft-decoding process) according to the obtained soft-bit information, so as to try to correct an error existed in a code word to be currently decoded. In the present exemplary embodiment, the error correcting capability of the soft-decoding process is higher than the error correcting capability of the hard-decoding process. If the executed soft-decoding process is failed, more soft-decoding processes can be repeatedly executed.

Figure 9:
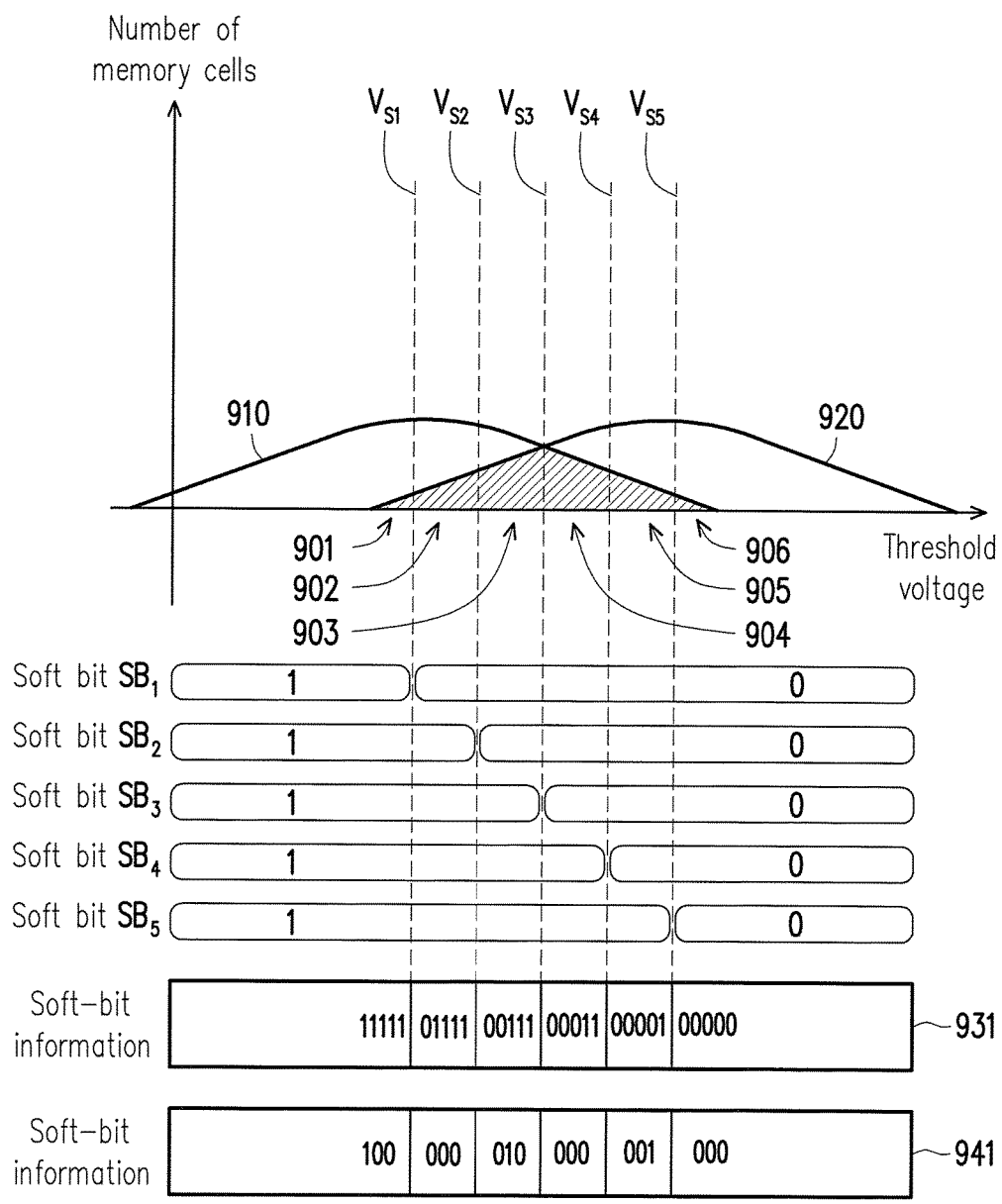
FIG. 9 is a schematic diagram of a soft-decoding process according to an exemplary embodiment of the disclosure.

FIG. 9 is a schematic diagram of a soft-decoding process according to an exemplary embodiment of the disclosure.

Referring to FIG. 9, after the first hard-decoding process is failed, the memory management circuit 502 may select to send a soft-reading command sequence to the rewritable non-volatile memory module 406. The soft-reading command sequence indicates to read the first memory cell or the physical unit where the first memory cell belongs to based on a plurality of soft-decision voltage levels (for example, reading voltage levels $V_{S1}$-$V_{S5}$). According to the soft-reading command sequence, the rewritable non-volatile memory module 406 uses the soft-decision voltage levels (for example, the reading voltage levels $V_{S1}$-$V_{S5}$) to read the first memory cell and transmits obtained soft-bit information 931 to the memory management circuit 502. The obtained soft-bit information 931 may include a plurality of soft bits $SB_1$-$SB_5$ read from each of the first memory cells.

In the present exemplary embodiment, it is assumed that the soft-bit information, the first hard-bit information and the second hard-bit information are all obtained by reading the same (for example, the same number of) first memory cells, and a total number of the hard bits in the first hard-bit information (or a total number of the hard bits in the second hard-bit information) is smaller than a total number of soft bits in the soft-bit information.

In the present exemplary embodiment, the soft bits $SB_1$-$SB_5$ obtained by sequentially applying reading voltage levels $V_{S1}$-$V_{S5}$ to a certain memory cell can be used for representing one of regions 901-906 where the threshold voltage of the memory cell belongs to. For example, if the soft bits $SB_1$-$SB_5$ obtained by reading a certain memory cell is "11111", it represents that the threshold voltage of the memory cell belongs to the region 901; if the soft bits $SB_1$-$SB_5$ obtained by reading a certain memory cell is "01111", it represents that the threshold voltage of the memory cell belongs to the region 902; if the soft bits $SB_1$-$SB_5$ obtained by reading a certain memory cell is "00111", it represents that the threshold voltage of the memory cell belongs to the region 903; if the soft bits $SB_1$-$SB_5$ obtained by reading a certain memory cell is "00011", it represents that the threshold voltage of the memory cell belongs to the region 904; if the soft bits $SB_1$-$SB_5$ obtained by reading a certain memory cell is "00001", it represents that the threshold voltage of the memory cell belongs to the region 905; and if the soft bits $SB_1$-$SB_5$ obtained by reading a certain memory cell is "00000", it represents that the threshold voltage of the memory cell belongs to the region 906.

In an exemplary embodiment, before transmitting the soft-bit information to the memory management circuit 502, the rewritable non-volatile memory module 406 may perform a logic operation on at least a part of the soft bits corresponding to the same memory cell, so as to reduce the total number of the soft bits in the soft-bit information. Taking FIG. 9 as an example, the rewritable non-volatile memory module 406 may perform a logical exclusive OR (XOR) operation on the soft bits $SB_2$ and $SB_3$ corresponding to a certain memory cell to obtain a first operation result, and perform the logical XOR operation on the soft bits $SB_4$ and $SB_5$ corresponding to the memory cell to obtain a second operation result, and take the soft bit $SB_1$, the first operation result and the second operation result of the memory cell as soft-bit information 941 corresponding to the memory cell for transmitting to the memory management circuit 502, where the first operation result and the second operation result can be respectively regarded as one soft bit. Compared to the soft-bit info nation 931, since the soft-bit information 941 includes less number of the soft bits, the soft-bit information 941 can be more quickly transmitted to the memory management circuit 502.

The error checking and correcting circuit 508 executes a soft-decoding process according to the obtained soft-bit information, so as to try to correct errors existed in a code word. For example, each bit in the code word is obtained by using one of the reading voltage levels $V_{S1}$-$V_{S5}$ to read a certain memory cell. In an exemplary embodiment, the soft-decision voltage used for reading each bit in the code word is also referred to as a sign reading voltage level.

In an exemplary embodiment, the error checking and correcting circuit 508 may further inquire a look-up table to obtain a set of channel reliability information. For example, each bit in the code word to be decoded corresponds to one element of channel reliability information, and the channel reliability information is used for representing a probability that each bit in the code word should be decoded into "1" or "0". In this way, the error checking and correcting circuit 508 may execute the soft-decoding process according to the channel reliability information and the obtained soft-bit information. Moreover, in another exemplary embodiment, the soft-bit information can also be used for updating the used channel reliability information.

In an exemplary embodiment, each soft bit in the soft-bit information can also be referred to as a verification bit, and the reliability information refers to a log likelihood ratio (LLR). Those skilled in the art should understand how to execute the soft-decoding process according to the channel reliability information (for example, the LLR) and the obtained soft-bit information, and detail thereof is not repeated. Moreover, regarding a different decoding algorithm, the channel reliability information adopted in the soft-decoding process may also refer to other channel information used for describing a channel state, which is not limited by the disclosure.

In the soft-decoding process, if the errors in the code word are all corrected, it represents that the decoding is successful, and the error checking and correcting circuit 508 outputs the successfully decoded bits and ends the soft-decoding process (or the whole decoding process). However, if the errors in the code word are not all corrected, it represents that the decoding process is failed, and the memory management circuit 502 may adjust the soft-decision voltage levels used for reading the first memory cell for the next time, and more soft-decoding processes can be subsequently executed.

In an exemplary embodiment, if the first hard-decoding process is failed, the memory management circuit 502 determines whether the first memory cell belongs to a first type memory cell or a second type memory cell, where a wear degree of the first type memory cell is lower than a wear degree of the second type memory cell. If the first memory cell belongs to the first type memory cell, it represents that the wear degree of the first memory cell is not high, and the memory management circuit 502 selects to further use more hard-decoding processes to decode the data stored in the first memory cell. For example, the memory management circuit 502 may send the aforementioned second hard-reading command sequence and instruct the error checking and correcting circuit 508 to execute the second hard-decoding process according to the obtained second hard-bit information. The exemplary embodiment of FIG. 8 can be referred for the operation detail of the hard-decoding process, and detail thereof is not repeated. Compared to the situation of directly adopting the soft-decoding process after the first hard-decoding process fails, although a decoding success rate of the hard-decoding process is relatively low, the hard-decoding process has an advantage of a faster decoding speed. Regarding the first type memory cell, to continually adopt the hard-decoding process still has a high probability of quickly and successfully complete the whole decoding process.

On the other hand, if the first memory cell belongs to the second type memory cell, it represents that the wear degree of the first memory cell is relatively high, and the memory management circuit 502 directly uses the soft-decoding process to decode the data stored in the first memory cell. For example, the memory management circuit 502 may send the aforementioned soft-reading command sequence and instruct the error checking and correcting circuit 508 to execute the soft-decoding process according to the obtained soft-bit information. The exemplary embodiment of FIG. 9 can be referred for the operation detail of the soft-decoding process, and detail thereof is not repeated. Compared to the situation of continually adopting the hard-decoding process, although the decoding speed of the soft-decoding process is relatively slow (due to high operation complexity), the soft-decoding process has an advantage of a high decoding success rate. Therefore, regarding the second type memory cell, to directly adopt the soft-decoding process after the first hard-decoding process fails has a higher probability of accelerating completion of the whole decoding process.

In an exemplary embodiment, the memory management circuit 502 determines whether the wear degree of the first memory cell is complied with a predetermined condition. If the wear degree of the first memory cell is complied with the predetermined condition, the memory management circuit 502 determines that the first memory cell belongs to the first type memory cell. If the wear degree of the first memory cell is not complied with the predetermined condition, the memory management circuit 502 determines that the first memory cell belongs to the second type memory cell.

In an exemplary embodiment, the memory management circuit 502 determines whether a threshold voltage distribution of the first memory cell is complied with a predetermined distribution. If the threshold voltage distribution of the first memory cell is complied with the predetermined distribution, the memory management circuit 502 determines that the wear degree of the first memory cell is complied with the predetermined condition and the first memory cell belongs to the first type memory cell. If the threshold voltage distribution of the first memory cell is not complied with the predetermined distribution, the memory management circuit 502 determines that the wear degree of the first memory cell is not complied with the predetermined condition and the first memory cell belongs to the second type memory cell.

In an exemplary embodiment, if the threshold voltage distribution of the first memory cell is similar to the distributions 711 and 721 in FIG. 7, the first memory cell is determined to belong to the first type memory cell. If the threshold voltage distribution of the first memory cell is similar to the distributions 712 and 722 in FIG. 7, the first memory cell is determined to belong to the second type memory cell. For example, at least one distribution model can be used to define the threshold voltage distributions complied with the predetermined distribution and/or the threshold voltage distributions not complied with the predetermined distribution.

In an exemplary embodiment, if a total number of the first memory cells with the threshold voltage belonging to a certain overlapped region (for example, the overlapped region 731 of FIG. 7) is smaller than a predetermined number, the first memory cells are determined to belong to the first type memory cell. If the total number of the first memory cells with the threshold voltage belonging to a certain overlapped region (for example, the overlapped region 741 of FIG. 7) is greater than the predetermined number, the first memory cells are determined to belong to the second type memory cell.

In an exemplary embodiment, the memory management circuit 502 determines whether a wear degree value of the first memory cell is smaller than a predetermined value. If the wear degree value of the first memory cell is smaller than the predetermined value, the memory management circuit 502 determines that the wear degree of the first memory cell is complied with the predetermined condition and the first memory cell belongs to the first type memory cell. If the wear degree value of the first memory cell is greater than or equal to the predetermined value, the memory management circuit 502 deter' lines that the wear degree of the first memory cell is not complied with the predetermined condition and the first memory cell belongs to the second type memory cell.

In an exemplary embodiment, the memory management circuit 502 determines the wear degree value of the first memory cell according to a wear parameter of the first memory cell. For example, the wear parameter of the first memory cell includes at least one of an erasing count, a programming count, a reading count, a bit error rate, a data storage time, a programming busy time and a retry count.

The erasing count of the first memory cell represents the number of times that at least one of the first memory cells is erased or an average number of times that the first memory cells are erased. The programming count of the first memory cell represents the number of times that at least one of the first memory cells is programmed or an average number of times that the first memory cells are programmed. The reading count of the first memory cell represents the number of times that at least one of the first memory cells is read or an average number of times that the first memory cells are read.

The bit error rate of the first memory cell represents the number of error bits in the bit data stored in at least one of the first memory cells or an average number of the error bits in the bit data stored in the first memory cells. The data storage time of the first memory cell represents a (average) storage time of the data currently stored in at least one of the first memory cells.

The programming busy time of the first memory cell represents a busy time required for programming the first memory cell or an average busy time required for programming the first memory cell by multiple times. For example, when the first memory cell is programmed (for example, a certain batch of data is stored into the first memory cell), the memory management circuit 502 records a busy time used for programming the first memory cell, and determines the (average) programming busy time of the first memory cell according to the recorded busy time. Within the busy time, programming of the first memory cell is not completed.

The retry count of the first memory cell represents a total number of the hard-decoding processes required to be repeatedly executed in order to complete decoding corresponding to the first memory cell or a memory cell associated with the first memory cell (which is referred to as a second memory cell hereinafter), or an average number of the hard-decoding processes required to be repeatedly executed in order to complete decoding corresponding to the first memory cell or the second memory cell. In an exemplary embodiment, the memory management circuit 502 instructs to program the second memory cell in the rewritable non-volatile memory module 406. Thereafter, when data stored in the second memory cell is read, the error checking and correcting circuit 508 executes the hard-decoding process by at least once (which is referred to as a first number of times) on the read data corresponding to the second memory cell. The memory management circuit 502 records the first number and determines the retry count of the first memory cell according to the first number.

In an exemplary embodiment, a logical unit mapped to the first memory cell (which is referred to as a first logical unit hereinafter) follows another logical unit mapped to the second memory cell (which is referred to as a second logical unit hereinafter). For example, when the host system 11 instructs to store a batch of data to a plurality of continually arranged (or numbered) logical units, a first part of the data is first stored to the second logical unit, and a second part of the data is subsequently stored to the first logical unit. Therefore, if the first part of the data is stored to the second memory cell and the second part of the data is stored to the first memory cell, the second logical unit is mapped to the second memory cell or the physical unit where the second memory cell belongs to, and the first logical unit is mapped to the first memory cell or the physical unit where the first memory cell belongs to. Thereafter, when data stored in the second memory cell and the first memory cell is consecutively read, one or more hard-decoding processes corresponding to the second memory cell is first executed, and the memory management circuit 502 accordingly updates the retry count of the first memory cell. Then, when the decoding process corresponding to the first memory cell is to be executed, the memory management circuit 502 may determine whether the first memory cell belongs to the first type memory cell or the second type memory cell according to the retry count of the first memory cell. In an exemplary embodiment, the first memory cell and the second memory cell are included in (or belong to) a same physical erasing unit in the rewritable non-volatile memory module 406.

In an exemplary embodiment, the wear parameter of the first memory cell is positively correlated to the wear degree value of the first memory cell. For example, the higher the at least one of the erasing count, the programming count, the reading count, the bit error rate, the data storage time, the programming busy time and the retry count of the first memory cell is, the greater the wear degree value of the first memory cell is. For example, in an exemplary embodiment, when the erasing count of the first memory cell is smaller than 200, the first memory cell is regarded as the first type memory cell; and when the first memory cell is continually used to result in a fact that the erasing count thereof is higher than 200, the first memory cell is regarded as the second type memory cell. Moreover, in another exemplary embodiment, various parameters such as ambient temperature, humidity, etc. that are capable of influencing the reliability of the memory cell along with a usage time, a usage state or a usage degree of the memory cell can be regarded as the wear parameters of the first memory cell, and influence the determination on the first memory cell for determining whether the first memory cell belongs to the first type memory cell (or the second type memory cell).

In an exemplary embodiment, after the first memory cell is determined to belong to one of the first type memory cell and the second type memory cell, the determination result can be directly applied to other memory cell (which is referred to as a third memory cell) belonging to the same physical erasing unit together with the first memory cell. Thereafter, when a first hard-decoding process corresponding to the third memory cell is failed, the determination result can be used to determine whether the hard-decoding process corresponding to the third memory cell is continually used or the soft-decoding process is directly switched. Alternatively, in another exemplary embodiment, after the second memory cell mentioned above is determined to belong to one of the first type memory cell and the second type memory cell, the determination result can be directly applied to the first memory cell.

In an exemplary embodiment, in the soft-decoding process executed after execution of the first hard-decoding process, the used channel reliability information is a set of predetermined channel reliability information. If the soft-decoding process using the predetermined channel reliability information is failed, the memory management circuit 502 tracks an optimal reading voltage level and adjust the soft-decision voltage level according to the optimal reading voltage level. Taking FIG. 9 as an example, the optimal reading voltage level is set to the lowest point of a "V" shape formed between the distribution 910 and the distribution 920 (for example, around the reading voltage level $V_{S3}$). Then, the memory management circuit 502 may instruct to again read the first memory cell based on the adjusted soft-decision voltage level to obtain corresponding soft-bit information, and the error checking and correcting circuit 508 may execute a next soft-decoding process according to the obtained soft-bit information and the predetermined channel reliability information. If the soft-decoding process corrects all of the errors in the corresponding code word, it represents that the decoding is successful, and the error checking and correcting circuit 508 outputs the successfully decoded bits and ends the soft-decoding process (or end the whole decoding process).

If the soft-decoding process is still failed, the memory management circuit 502 determines whether the number of execution times of the soft-decoding processes reaches another threshold value (which is referred to as a second threshold value hereinafter). If the number of execution times of the soft-decoding processes has reached the second threshold value, the memory management circuit 502 determines that the decoding is failed, and ends the soft-decoding process (or end the whole decoding process). If the number of execution times of the soft-decoding processes does not reach the second threshold value, the memory management circuit 502 may again look up the aforementioned look-up table to adjust the used channel reliability information, and further execute a next soft-decoding process according to the adjusted channel reliability information.

Figure 10:
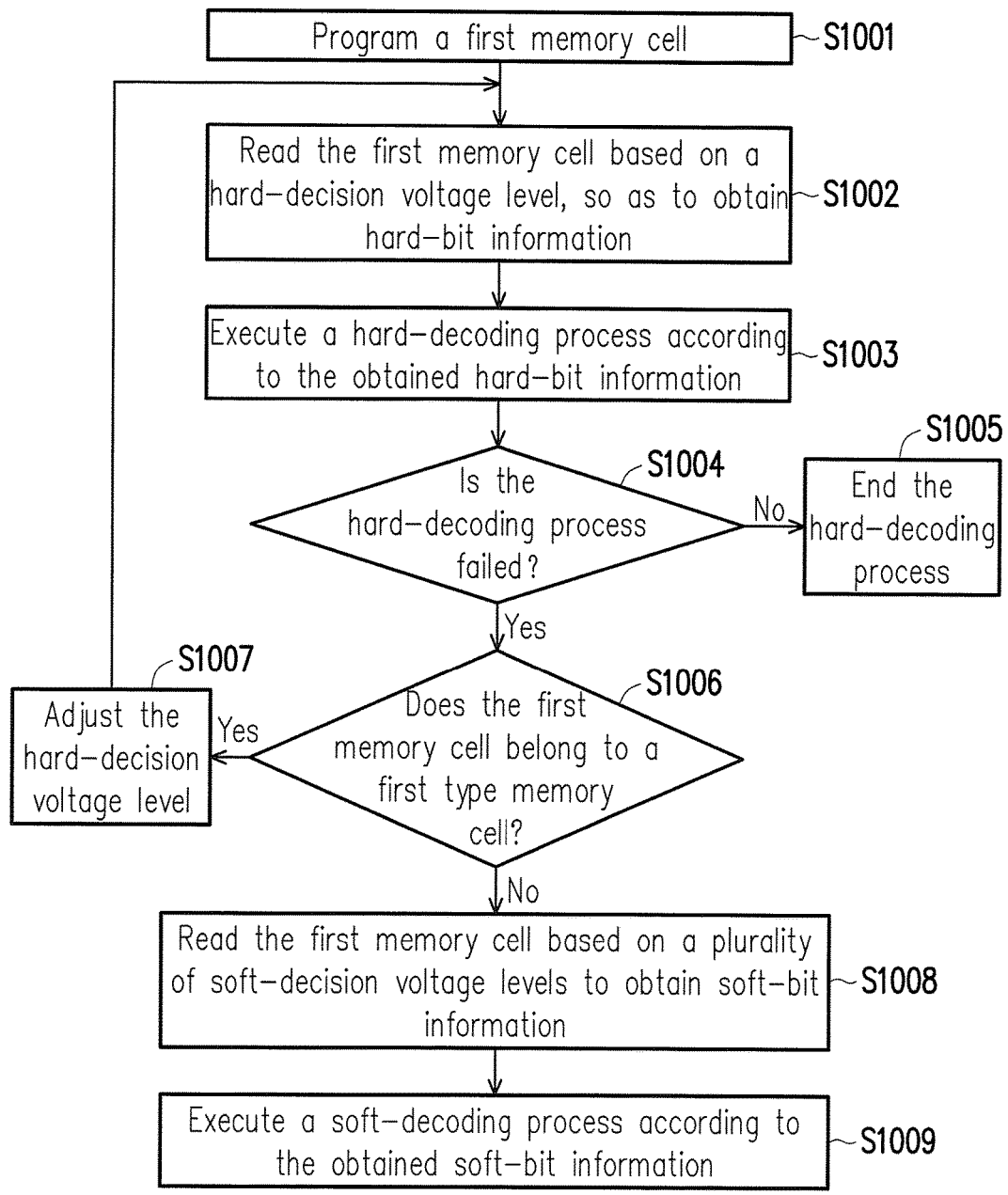
FIG. 10 is a flowchart illustrating a decoding method according to an exemplary embodiment of the disclosure.

FIG. 10 is a flowchart illustrating a decoding method according to an exemplary embodiment of the disclosure.

Referring to FIG. 10, in step S1001, a first memory cell is programmed. In step S1002, the first memory cell is read based on a hard-decision voltage level, so as to obtain hard-bit information. In step S1003, a hard-decoding process is performed according to the obtained hard-bit information. In step S1004, it is determined whether the hard-decoding process fails (or succeeds). If the hard-decoding process succeeds, in step S1005, the successfully decoded bit is output and the hard-decoding process is ended. If the hard-decoding process fails, in step S1006, it is determined whether the first memory cell belongs to a first type memory cell (or a second type memory cell). If the first memory cell belongs to the first type memory cell, in step S1007, the hard-decision voltage level is adjusted. Then, the step S1002 and the subsequent steps are repeatedly executed. It should be noted that in the repeatedly executed step S1002, the hard-decision voltage level adjusted in the step S1007 is used to read the first memory cell. If the first memory cell does not belong to the first type memory cell (i.e. belongs to the second type memory cell), in step S1008, the decoding mode is switched to a soft-decoding mode, and the first memory cell is read based on a plurality of soft-decision voltage levels to obtain soft-bit information. In step S1009, a soft-decoding process is executed according to the obtained soft-bit information.

Figure 11A:
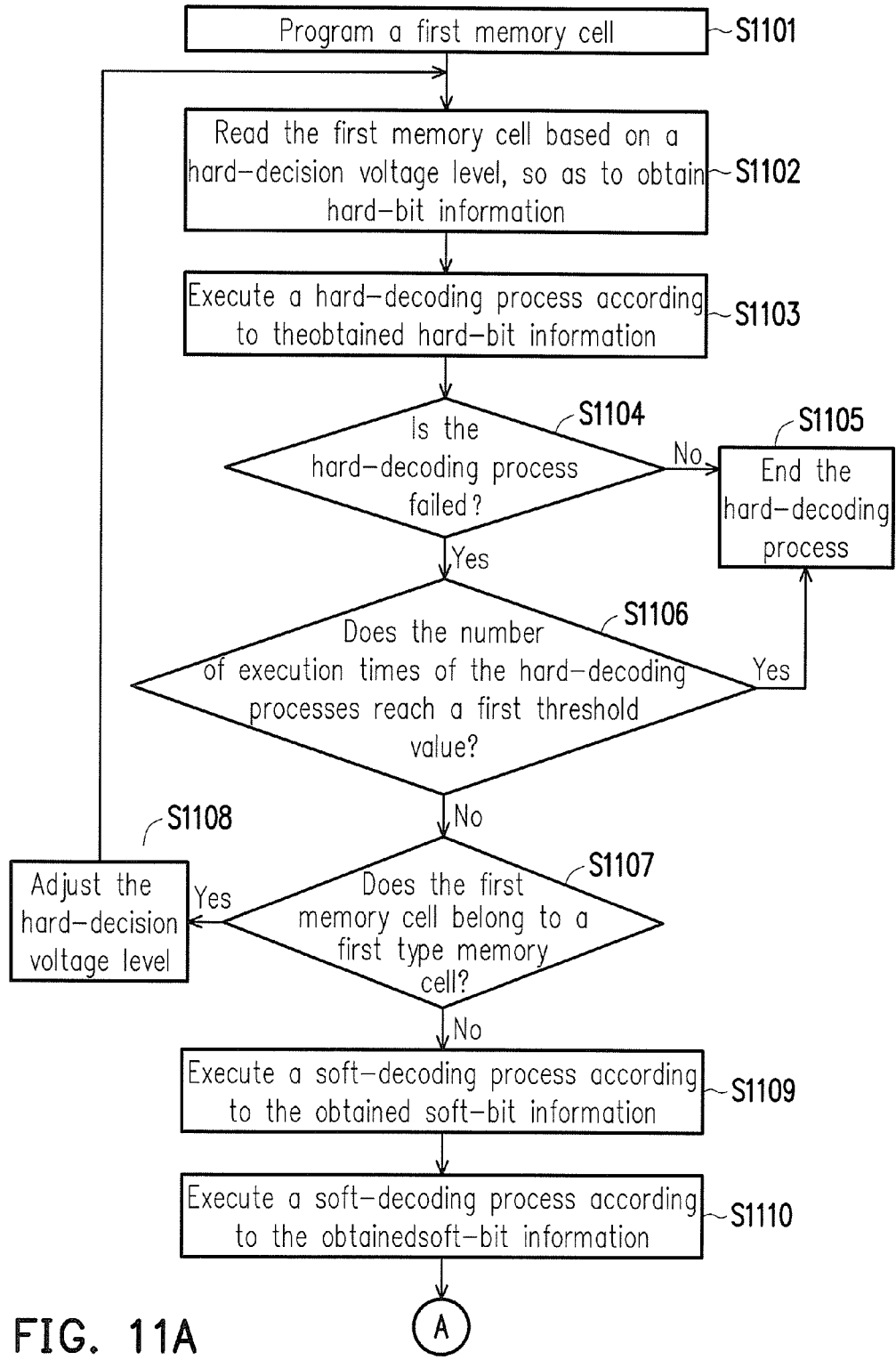
FIG. 11A and FIG. 11B are flowcharts illustrating a decoding method according to another exemplary embodiment of the disclosure.
Figure 11B:
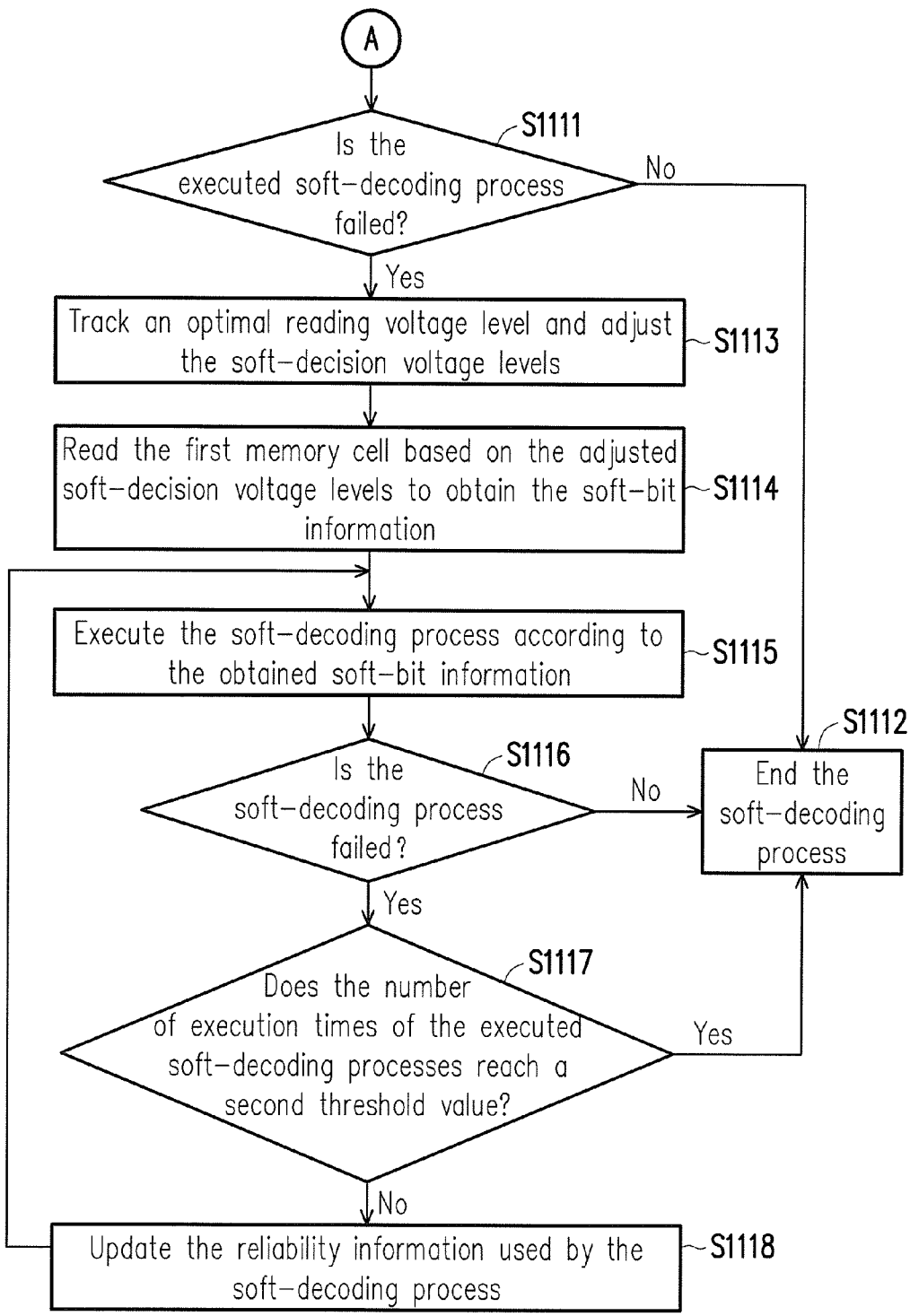

FIG. 11A and FIG. 11B are flowcharts illustrating a decoding method according to another exemplary embodiment of the disclosure.

Referring to FIG. 11A, in step S1101, a first memory cell is programmed. In step S1102, the first memory cell is read based on a hard-decision voltage level, so as to obtain hard-bit information. In step S1103, a hard-decoding process is performed according to the obtained hard-bit information. In step S1104, it is determined whether the hard-decoding process fails (or succeeds). If the hard-decoding process succeeds, in step S1105, the successfully decoded bit is output and the hard-decoding process is ended. If the hard-decoding process fails, in step S1106, it is determined whether the number of execution times of the executed hard-decoding processes has reached a first threshold value. If the number of execution times of the executed hard-decoding processes has reached the first threshold value (for example, higher than or equal to the first threshold value), the step S1105 is again executed (e.g., ending the decoding process). If the number of execution times of the executed hard-decoding processes does not reach the first threshold value (for example, lower than the first threshold value), in step S1107, it is determined whether the first memory cell belongs to a first type memory cell (or a second type memory cell). If the first memory cell belongs to the first type memory cell, in step S1108, the hard-decision voltage level is adjusted. Then, the step S1102 and the subsequent steps are repeatedly executed. If the first memory cell does not belong to the first type memory cell (i.e. belongs to the second type memory cell), in step S1109, the first memory cell is read based on a plurality of soft-decision voltage levels to obtain soft-bit information. In step S1110, a soft-decoding process is executed according to the obtained soft-bit information.

Referring to FIG. 11B, in step S1111, it is determined whether the executed soft-decoding process fails (or succeeds). If the executed soft-decoding process succeeds, in step S1112, the successfully decoded bit is output and the soft-decoding process is ended. If the executed soft-decoding process fails, in step S1113, an optimal reading voltage level is tracked and the soft-decision voltage levels are adjusted. In step S1114, the first memory cell is read based on the adjusted soft-decision voltage levels to obtain the soft-bit information. In step S1115, the soft-decoding process is executed according to the obtained soft-bit information. In step S1116, it is deter wined whether the executed soft-decoding process fails (or succeeds). If the executed soft-decoding process succeeds, the step S1112 is continually executed. If the executed soft-decoding process fails, in step S1117, it is determined whether the number of execution times of the executed soft-decoding processes has reached a second threshold value. If the number of execution times of the executed soft-decoding processes has reached the second threshold value (for example, higher than or equal to the second threshold value), the step S1112 is again executed (e.g., ending the decoding process). If the number of execution times of the executed soft-decoding processes does not reach the second threshold value (for example, lower than the second threshold value), in step S1118, the reliability information (for example, the LLR information) used by the soft-decoding process is updated. Then, the step S1115 and the subsequent steps are repeatedly executed.

However, various steps of FIG. 10, FIG. 11A and FIG. 11B have been described in detail in the aforementioned description, and details thereof are not repeated. It should be noted that the various steps of FIG. 10, FIG. 11A and FIG. 11B can be implemented by a plurality of program codes or circuits, which is not limited by the disclosure. Moreover, the methods shown in FIG. 10, FIG. 11A and FIG. 11B can be used in collaboration with the aforementioned exemplary embodiments, and can also be used alone, which is not limited by the disclosure.

In summary, if a first hard-decoding process corresponding to the first memory cell is failed and the first memory cell belongs to the first type memory cell, decoding of the first memory cell is still maintained to the hard-decoding mode. However, if the first hard-decoding process corresponding to the first memory cell is failed and the first memory cell does not belong to the first type memory cell (for example, the first memory cell belongs to the second type memory cell), decoding of the first memory cell is directly switched to the soft-decoding mode. In this way, compared to the general standard decoding process (for example, only the hard-decoding is executed, or the soft-decoding is directly switched after the hard-decoding is failed), in the disclosure, it may achieve a balance between the decoding speed and the decoding success rate according to a usage state of the memory cells.

The previously described exemplary embodiments of the present disclosure have the advantages aforementioned, wherein the advantages aforementioned not required in all versions of the disclosure.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A decoding method, adapted to a rewritable nonvolatile memory module comprising a plurality of memory cells, the decoding method comprising:
    sending, via a memory interface, a writing command sequence indicating to program at least one first memory cell among the memory cells;
    sending, via the memory interface, a first hard-reading command sequence indicating to read the at least one first memory cell based on a first hard-decision voltage level, so as to obtain first hard-bit information;
    performing, by an error checking and correcting circuit, a hard-decoding process according to the first hard-bit information and determining, by a memory management circuit, whether the hard-decoding process fails;
    determining, by the memory management circuit, whether the at least one first memory cell belongs to a first type memory cell or a second type memory cell if the hard-decoding process fails;
    sending, via the memory interface, a second hard-reading command sequence indicating to read the at least one first memory cell based on a second hard-decision voltage level if the at least one first memory cell belongs to the first type memory cell, so as to obtain second hard-bit information, and performing, by the error checking and correcting circuit, the hard-decoding process according to the second hard-bit information, wherein the second hard-decision voltage level is different to the first hard-decision voltage level, wherein a total number of a first hard bit included in the first hard-bit information is equal to a total number of a second hard bit included in the second hard-bit information; and
    sending, via the memory interface, a soft-reading command sequence indicating to read the first memory cell based on a plurality of soft-decision voltage levels if the first memory cell belongs to the second type memory cell, so as to obtain soft-bit information, and performing, by the error checking and correcting circuit, a soft-decoding process according to the soft-bit information, wherein the total number of the second hard bit included in the second hard-bit information is smaller than a total number of a soft bit included in the soft-bit information.

2. The decoding method as claimed in claim 1, wherein the step of determining whether the at least one first memory cell belongs to the first type memory cell or the second type memory cell comprises:
    determining that the at least one first memory cell belongs to the first type memory cell if a wear degree of the at least one first memory cell is complied with a predetermined condition; and
    determining that the at least one first memory cell belongs to the second type memory cell if the wear degree of the at least one first memory cell is not complied with the predetermined condition.

3. The decoding method as claimed in claim 2, wherein the step of determining whether the at least one first memory cell belongs to the first type memory cell or the second type memory cell further comprises:
    determining whether a wear degree value of the at least one first memory cell is smaller than a predetermined value;
    determining that the wear degree of the at least one first memory cell is complied with the predetermined condition if the wear degree value of the at least one first memory cell is smaller than the predetermined value; and
    determining that the wear degree of the at least one first memory cell is not complied with the predetermined condition if the wear degree value of the at least one first memory cell is greater than or equal to the predetermined value.

4. The decoding method as claimed in claim 3, wherein the step of determining whether the at least one first memory cell belongs to the first type memory cell or the second type memory cell further comprises:

determining the wear degree value of the at least one first memory cell according to a wear parameter of the at least one first memory cell, wherein the wear parameter of the at least one first memory cell comprises at least one of an erasing count, a programming count, a reading count, a bit error rate, a data storage time, a programming busy time and a retry count.

5. The decoding method as claimed in claim 4, further comprising:

recording a busy time used for programming the at least one first memory cell when the at least one first memory cell is programmed; and determining the programming busy time according to the busy time.

6. The decoding method as claimed in claim 4, further comprising:

programming at least one second memory cell among the memory cells;

reading the at least one second memory cell and executing the hard-decoding process by a first number of times corresponding to the at least one second memory cell; and determining the retry count according to the first number.

7. The decoding method as claimed in claim 6, wherein a first logical unit mapped to the at least one first memory cell follows a second logical unit mapped to the at least one second memory cell.

8. The decoding method as claimed in claim 6, wherein the at least one first memory cell and the at least one second memory cell belong to a same physical erasing unit in the rewritable non-volatile memory module.

9. The decoding method as claimed in claim 2, wherein the step of determining whether the at least one first memory cell belongs to the first type memory cell or the second type memory cell further comprises:

determining whether a threshold voltage distribution of the at least one first memory cell is complied with a predetermined distribution;

determining that the wear degree of the at least one first memory cell is complied with the predetermined condition if the threshold voltage distribution of the at least one first memory cell is complied with the predetermined distribution; and determining that the wear degree of the at least one first memory cell is not complied with the predetermined condition if the threshold voltage distribution of the at least one first memory cell is not complied with the predetermined distribution.

10. A memory storage device, comprising:

a connection interface unit, coupled to a host system;

a rewritable non-volatile memory module, comprising a plurality of memory cells; and a memory control circuit unit, coupled to the connection interface unit and the rewritable non-volatile memory module, wherein the memory control circuit unit is configured to send, via a memory interface, a writing command sequence indicating to program at least one first memory cell among the memory cells, wherein the memory control circuit unit is further configured to send, via the memory interface, a first hard-reading command sequence indicating to read the at least one first memory cell based on a first hard-decision voltage level, so as to obtain first hard-bit information, wherein the memory control circuit unit is further configured to execute, by an error checking and correcting circuit, a hard-decoding process according to the first hard-bit information and determine, by a memory management circuit, whether the hard-decoding process fails, wherein the memory control circuit unit is further configured to determine, by the memory management circuit, whether the at least one first memory cell belongs to a first type memory cell or a second type memory cell if the hard-decoding process fails, wherein the memory control circuit unit is further configured to send, via the memory interface, a second hard-reading command sequence indicating to read the at least one first memory cell based on a second hard-decision voltage level, so as to obtain second hard-bit information if the at least one first memory cell belongs to the first type memory cell, wherein the memory control circuit unit is further configured to perform, by the error checking and correcting circuit, the hard-decoding process according to the second hard-bit information, wherein the second hard-decision voltage level is different to the first hard-decision voltage level, wherein a total number of a first hard bit included in the first hard-bit information is equal to a total number of a second hard bit included in the second hard-bit information, wherein the memory control circuit unit is further configured to send, via the memory interface, a soft-reading command sequence indicating to read the at least one first memory cell based on a plurality of soft-decision voltage levels, so as to obtain soft-bit information if the at least one first memory cell belongs to the second type memory cell, wherein the memory control circuit unit is further configured to execute, by the error checking and correcting circuit, a soft-decoding process according to the soft-bit information, wherein the total number of the second hard bit included in the second hard-bit information is smaller than a total number of a soft bit included in the soft-bit information.

11. The memory storage device as claimed in claim 10, wherein the operation that the memory control circuit unit determines whether the at least one first memory cell belongs to the first type memory cell or the second type memory cell comprises:

determining that the at least one first memory cell belongs to the first type memory cell if a wear degree of the at least one first memory cell is complied with a predetermined condition; and determining that the at least one first memory cell belongs to the second type memory cell if the wear degree of the at least one first memory cell is not complied with the predetermined condition.

12. The memory storage device as claimed in claim 11, wherein the operation that the memory control circuit unit determines whether the at least one first memory cell belongs to the first type memory cell or the second type memory cell further comprises:

determining whether a wear degree value of the at least one first memory cell is smaller than a predetermined value;

determining that the wear degree of the at least one first memory cell is complied with the predetermined condition if the wear degree value of the at least one first memory cell is smaller than the predetermined value; and determining that the wear degree of the at least one first memory cell is not complied with the predetermined condition if the wear degree value of the at least one first memory cell is greater than or equal to the predetermined value.

13. The memory storage device as claimed in claim 12, wherein the operation that the memory control circuit unit determines whether the at least one first memory cell belongs to the first type memory cell or the second type memory cell further comprises:

determining the wear degree value of the at least one first memory cell according to a wear parameter of the at least one first memory cell, wherein the wear parameter of the at least one first memory cell comprises at least one of an erasing count, a programming count, a reading count, a bit error rate, a data storage time, a programming busy time and a retry count.

14. The memory storage device as claimed in claim 13, wherein the memory control circuit unit is further configured to record a busy time used for programming the at least one first memory cell when the at least one first memory cell is programmed, wherein the memory control circuit unit is further configured to determine the programming busy time according to the busy time.

15. The memory storage device as claimed in claim 13, wherein the memory control circuit unit is further configured to instruct to program at least one second memory cell among the memory cells;

wherein the memory control circuit unit is further configured to instruct to read the at least one second memory cell and execute the hard-decoding process by a first number of times corresponding to the at least one second memory cell, wherein the memory control circuit unit is further configured to determine the retry count according to the first number.

16. The memory storage device as claimed in claim 15, wherein a first logical unit mapped to the at least one first memory cell follows a second logical unit mapped to the at least one second memory cell.

17. The memory storage device as claimed in claim 15, wherein the at least one first memory cell and the at least one second memory cell belong to a same physical erasing unit in the rewritable non-volatile memory module.

18. The memory storage device as claimed in claim 11, wherein the operation that the memory control circuit unit determines whether the at least one first memory cell belongs to the first type memory cell or the second type memory cell further comprises:

determining whether a threshold voltage distribution of the at least one first memory cell is complied with a predetermined distribution;

determining that the wear degree of the at least one first memory cell is complied with the predetermined condition if the threshold voltage distribution of the at least one first memory cell is complied with the predetermined distribution; and determining that the wear degree of the at least one first memory cell is not complied with the predetermined condition if the threshold voltage distribution of the at least one first memory cell is not complied with the predetermined distribution.

19. A memory control circuit unit, adapted to control a rewritable non-volatile memory module comprising a plurality of memory cells, the memory control circuit unit comprising:

a host interface, coupled to a host system;

a memory interface, coupled to the rewritable non-volatile memory module;

an error checking and correcting circuit; and a memory management circuit, coupled to the host interface, the memory interface and the error checking and correcting circuit, wherein the memory management circuit is configured to send, via the memory interface, a writing command sequence indicating to program at least one first memory cell among the memory cells, wherein the memory management circuit is further configured to send, via the memory interface, a first hard-reading command sequence indicating to read the at least one first memory cell based on a first hard-decision voltage level, so as to obtain first hard-bit information, wherein the error checking and correcting circuit is configured to execute a hard-decoding process according to the first hard-bit information, wherein the memory management circuit is further configured to determine whether the hard-decoding process fails, wherein the memory management circuit is further configured to determine whether the first memory cell belongs to a first type memory cell or a second type memory cell if the hard-decoding process fails, wherein the memory management circuit is further configured to send, via the memory interface, a second hard-reading command sequence indicating to read the at least one first memory cell based on a second hard-decision voltage level, so as to obtain second hard-bit information if the first memory cell belongs to the first type memory cell, wherein the error checking and correcting circuit is further configured to perform the hard-decoding process according to the second hard-bit information, wherein the second hard-decision voltage level is different to the first hard-decision voltage level, wherein a total number of a first hard bit included in the first hard-bit information is equal to a total number of a second hard bit included in the second hard-bit information, wherein the memory management circuit is further configured to send, via the memory interface, a soft-reading command sequence indicating to read the at least one first memory cell based on a plurality of soft-decision voltage levels, so as to obtain soft-bit information if the first memory cell belongs to the second type memory cell, wherein the error checking and correcting circuit is further configured to execute a soft-decoding process according to the soft-bit information, wherein the total number of the second hard bit included in the second hard-bit information is smaller than a total number of a soft bit included in the soft-bit information.

20. The memory control circuit unit as claimed in claim 19, wherein the operation that the memory management circuit determines whether the at least one first memory cell belongs to the first type memory cell or the second type memory cell comprises:

determining that the at least one first memory cell belongs to the first type memory cell if a wear degree of the at least one first memory cell is complied with a predetermined condition; and determining that the at least one first memory cell belongs to the second type memory cell if the wear degree of the at least one first memory cell is not complied with the predetermined condition.

21. The memory control circuit unit as claimed in claim 20, wherein the operation that the memory management circuit determines whether the at least one first memory cell belongs to the first type memory cell or the second type memory cell further comprises:

determining whether a wear degree value of the at least one first memory cell is smaller than a predetermined value;

determining that the wear degree of the at least one first memory cell is complied with the predetermined condition if the wear degree value of the at least one first memory cell is smaller than the predetermined value; and determining that the wear degree of the at least one first memory cell is not complied with the predetermined condition if the wear degree value of the at least one first memory cell is greater than or equal to the predetermined value.

22. The memory control circuit unit as claimed in claim 21, wherein the operation that the memory management circuit determines whether the at least one first memory cell belongs to the first type memory cell or the second type memory cell further comprises:

determining the wear degree value of the at least one first memory cell according to a wear parameter of the at least one first memory cell, wherein the wear parameter of the at least one first memory cell comprises at least one of an erasing count, a programming count, a reading count, a bit error rate, a data storage time, a programming busy time and a retry count.

23. The memory control circuit unit as claimed in claim 22, wherein the memory management circuit is further configured to record a busy time used for programming the at least one first memory cell when the at least one first memory cell is programmed, wherein the memory management circuit is further configured to determine the programming busy time according to the busy time.

24. The memory control circuit unit as claimed in claim 22, wherein the memory management circuit is further configured to instruct to program at least one second memory cell among the memory cells;

wherein the memory management circuit is further configured to instruct to read the at least one second memory cell, wherein the error checking and correcting circuit is further configured to execute the hard-decoding process by a first number of times corresponding to the at least one second memory cell, wherein the memory management circuit is further configured to determine the retry count according to the first number.

25. The memory control circuit unit as claimed in claim 24, wherein a first logical unit mapped to the at least one first memory cell follows a second logical unit mapped to the at least one second memory cell.

26. The memory control circuit unit as claimed in claim 24, wherein the at least one first memory cell and the at least one second memory cell belong to a same physical erasing unit in the rewritable non-volatile memory module.

27. The memory control circuit unit as claimed in claim 20, wherein the operation that the memory management circuit determines whether the at least one first memory cell belongs to the first type memory cell or the second type memory cell further comprises:

determining whether a threshold voltage distribution of the at least one first memory cell is complied with a predetermined distribution;

determining that the wear degree of the at least one first memory cell is complied with the predetermined condition if the threshold voltage distribution of the at least one first memory cell is complied with the predetermined distribution; and determining that the wear degree of the at least one first memory cell is not complied with the predetermined condition if the threshold voltage distribution of the at least one first memory cell is not complied with the predetermined distribution.

* * * * *